(12) United States Patent
 Khwa et al.

(10) Patent No.: US 12,562,203 B2
(45) Date of Patent: Feb. 24, 2026

(54) SENSING AMPLIFIER OF MEMORY ARRAY, MEMORY DEVICE AND DATA READ METHOD WITH TWO STATE REFERENCE VOLTAGES

(71) Applicant: Taiwan Semiconductor Manufacturing Company, Ltd., Hsinchu (TW)

(72) Inventors: Win-San Khwa, Taipei (TW); Meng-Fan Chang, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 183 days.

(21) Appl. No.: 18/516,792

(22) Filed: Nov. 21, 2023

(65) Prior Publication Data

US 2025/0166684 A1 May 22, 2025

(51) Int. Cl.
 G11C 11/16 (2006.01)
 G11C 7/06 (2006.01)

(52) U.S. Cl.
 CPC .......... G11C 11/1673 (2013.01); G11C 7/065 (2013.01); G11C 11/1655 (2013.01); G11C 11/1697 (2013.01)

(58) Field of Classification Search
 CPC ................................................ G11C 11/1673
 See application file for complete search history.

(56) References Cited

U.S. PATENT DOCUMENTS 5,258,958 A * 11/1993 Iwahashi ................ G11C 16/28
 365/185.11
2006/0262619 A1* 11/2006 Vernet .................... G11C 7/065
 365/205

* cited by examiner

*Primary Examiner* — Hoai V Ho

(74) *Attorney, Agent, or Firm* — JCIPRNET

(57) ABSTRACT

A sensing amplifier of a memory array, a memory device and a data read method with two state reference voltages are provided. The sensing amplifier comprises a sampling circuit, a latch circuit, and a reset circuit. The sampling circuit compares data voltages, a first state reference voltage, and a second state reference voltage according to a bit line precharge signal and a word line to generate a first sampling signal on the output node and a second sampling signal on the inverted output node. The latch circuit implements that the first sampling signal and the second sampling signal are inverted signals and latches the first sampling signal on an output node and the second sampling signal on the inverted output node.

20 Claims, 19 Drawing Sheets

FIG. 3

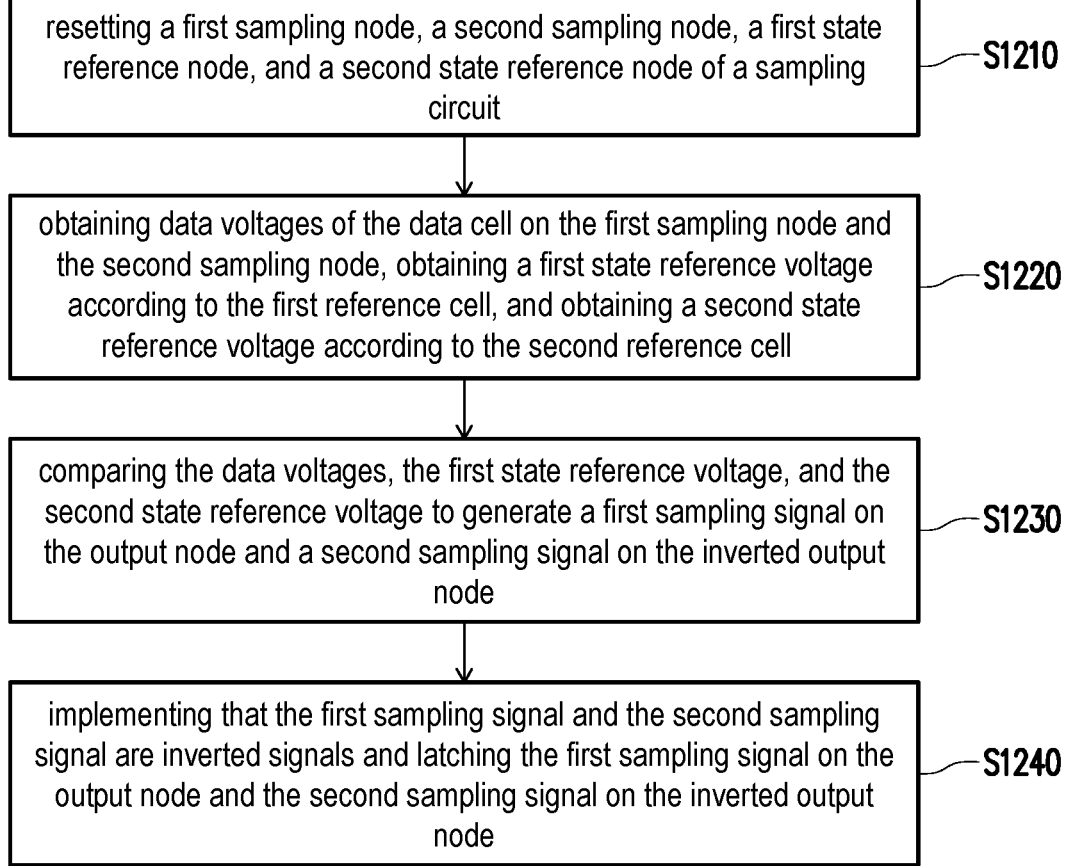

resetting a first sampling node, a second sampling node, a first state reference node, and a second state reference node of a sampling circuit — S1210 obtaining data voltages of the data cell on the first sampling node and the second sampling node, obtaining a first state reference voltage according to the first reference cell, and obtaining a second state reference voltage according to the second reference cell — S1220 comparing the data voltages, the first state reference voltage, and the second state reference voltage to generate a first sampling signal on the output node and a second sampling signal on the inverted output node — S1230 implementing that the first sampling signal and the second sampling signal are inverted signals and latching the first sampling signal on the output node and the second sampling signal on the inverted output node — S1240

FIG. 12

SENSING AMPLIFIER OF MEMORY ARRAY, MEMORY DEVICE AND DATA READ METHOD WITH TWO STATE REFERENCE VOLTAGES

BACKGROUND

Magnetic random access memory (MRAM) is a nonvolatile memory technology that uses magnetization to represent stored data. MRAMs are beneficial in that they retain stored data in the absence of electricity. MRAM structure includes a plurality of magnetic cells in an array, and each cell generally represents one bit of data. Generally, the way for reading one cell of the MRAM is to compare a read voltage from the cell of the MRAM and a reference voltage which distinguishes the cell in the parallel (P) state or in the anti-parallel (AP) state, so as to sense the stored data in this cell of the MRAM. However, the reference voltage may be a fixed value and may not be adjusted accordingly with the environment (i.e., temperature, pressure . . . etc.) where the MRAM is located, and the read margin of the MRAM structure may be narrow because of the reference voltage for reading cells of the MRAM.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 illustrates the memory device 300 according to some embodiments of the present disclosure.

FIGS. 4A-7A and FIGS. 4B-7B illustrate circuit operations of the sampling circuit in FIG. 3 and waveform diagrams of signals the sampling circuit while the state of the data cell is the P state according to some embodiments of the present disclosure.

FIGS. 8A-11A and FIGS. 8B-11B illustrate circuit operations of the sampling circuit in FIG. 3 and waveform diagrams of signals the sampling circuit while the state of the data cell is the AP state according to some embodiments of the present disclosure.

FIG. 12 illustrates a flow chart of a data read method of a memory array according to some embodiments of the present disclosure.

DESCRIPTION OF THE EMBODIMENTS

Figure 1:
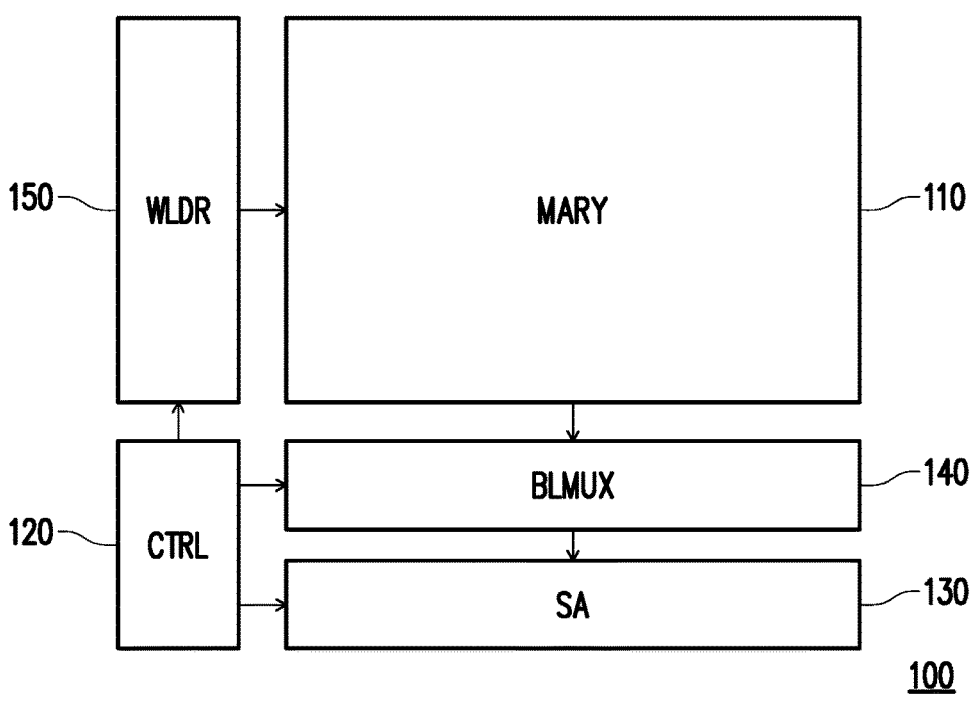
FIG. 1 illustrates a memory device 100 according to some embodiments of the present disclosure.

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a memory device 100 according to some embodiments of the present disclosure. The memory device 100 includes a memory array MARY 110, a control circuit CRTL 120, a sensing amplifier SA 130, a bit line multiplexer BLMUX 140, and a word line driver WLDR 150. The memory array 20 is formed by a plurality of memory cells. In the embodiment of the present disclosure, the memory device 100 is a non-volatile memory device, and the memory cells of the memory array MARY 110 are spin-transfer torque (STT) magneto-resistive random-access memory (MRAM) cells. The control circuit CRTL 120 controls the sensing amplifier SA 130, the bit line multiplexer BLMUX 140, and the word line driver WLDR 150 to access data stored in memory cells of the memory array MARY 110.

Figure 2:
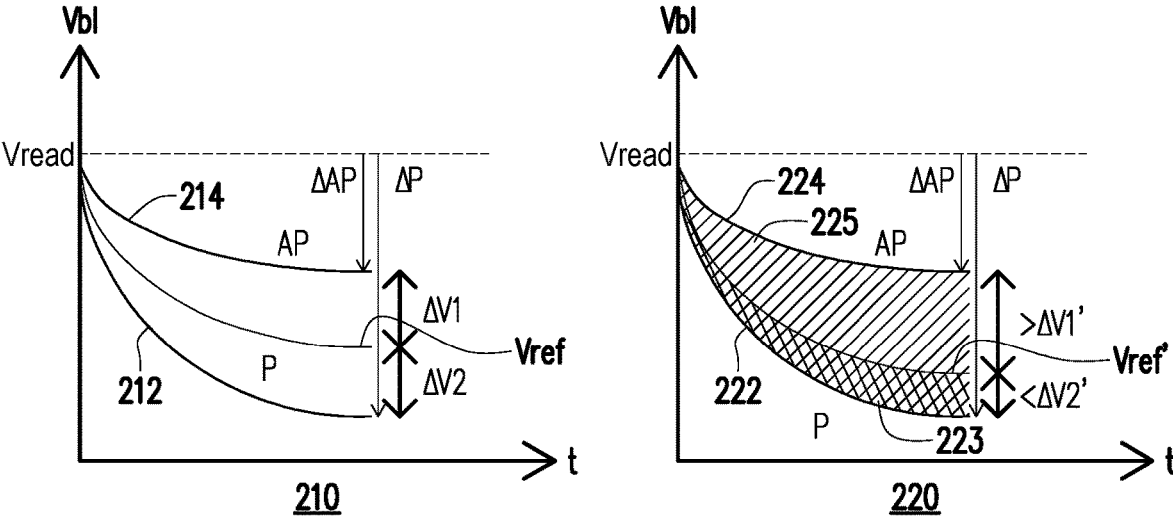
FIG. 2 illustrates schematics 210 and 220 of voltages of the parallel (P) state, the anti-parallel (AP) state read in the bit line of STT MRAM cell, and reference voltages Vref, Vref for illustrating read signal margin according to some embodiments of the present disclosure.

In some embodiments, the sensing amplifier SA 130 may only use one reference voltage to distinguish how a state of a target memory cell is (e.g., a parallel (P) state or an anti-parallel (AP) state of STT MRAM cells), but this way for distinguish the state of the target memory cell may not enhance the read signal margin of the data stored in STT MRAM cells. FIG. 2 illustrates schematics 210 and 220 of voltages of the parallel (P) state, the anti-parallel (AP) state read in the bit line of STT MRAM cell, and reference voltages Vref, Vref for illustrating read signal margin according to some embodiments of the present disclosure. The Y-axis of the schematics 210 and 220 in FIG. 2 presents voltages read from the bit line of a target STT MRAM cell as the P state (shown as the curves 212 and 222, respectively) or the AP state (shown as the curves 214 and 224, respectively). The voltage difference ΔP presents a voltage different of the voltage read from the target STT MRAM cell with the P state and the read voltage Vread, and the voltage difference ΔAP presents a voltage different of the voltage read from the target STT MRAM cell with the AP state and the read voltage Vread. In schematic 210, the reference voltage Vref is ideal for distinguish the states of the STT MRAM cell with the P state or the AP state, and the voltage difference ΔV1 between the curve 214 and the reference voltage Vref is the same as the voltage difference ΔV2 between the reference voltage Vref and the curve 22. But in real situation show in schematic 220, because the reference voltage Vref does not exactly at the middle of the curve 224 (shown as the AP state of the STT MRAM cell) and curve 222 (shown as the P state of the STT MRAM cell), the voltage difference ΔV1' between the curve 224 and the reference voltage Vref may larger than the voltage difference ΔV2' between the reference voltage Vref and the curve 222, thus read signal margin of STT MRAM cell with the P state are narrower than read signal margin of STT MRAM cell with the AP state. In other words, STT MRAM cells suffer from a small read signal margin (e.g., shown as a marked area 223 of the schematic 220 in FIG. 2) in sensing amplifier of the memory device.

In some embodiments of the present disclosure, for enlarging the read signal margin in sensing amplifier of the memory device, the sensing amplifier uses dual state reference voltages (e.g., two state reference voltages) for distinguish the states of the STT MRAM cells, one reference voltage is for presenting the P state of the STT MRAM cell, and another voltage is for presenting the AP state of the STT MRAM cell. Thus, the read signal margin shown in schematics 210 and 220 may be shown as a distance adding the voltage difference $\Delta V1/\Delta V1'$ and the voltage difference $\Delta V2/\Delta V2'$. The sensing amplifier in the embodiment does not need to generate a middle reference voltage between the two state reference voltages. The read signal margin with dual state reference voltages (e.g., shown as a marked area 225 of the schematic 220 in FIG. 2) is larger than the read signal margin with one reference voltage Vref or Vref (e.g., shown as the marked area 223 of the schematic 220 in FIG. 2).

Figure 3:
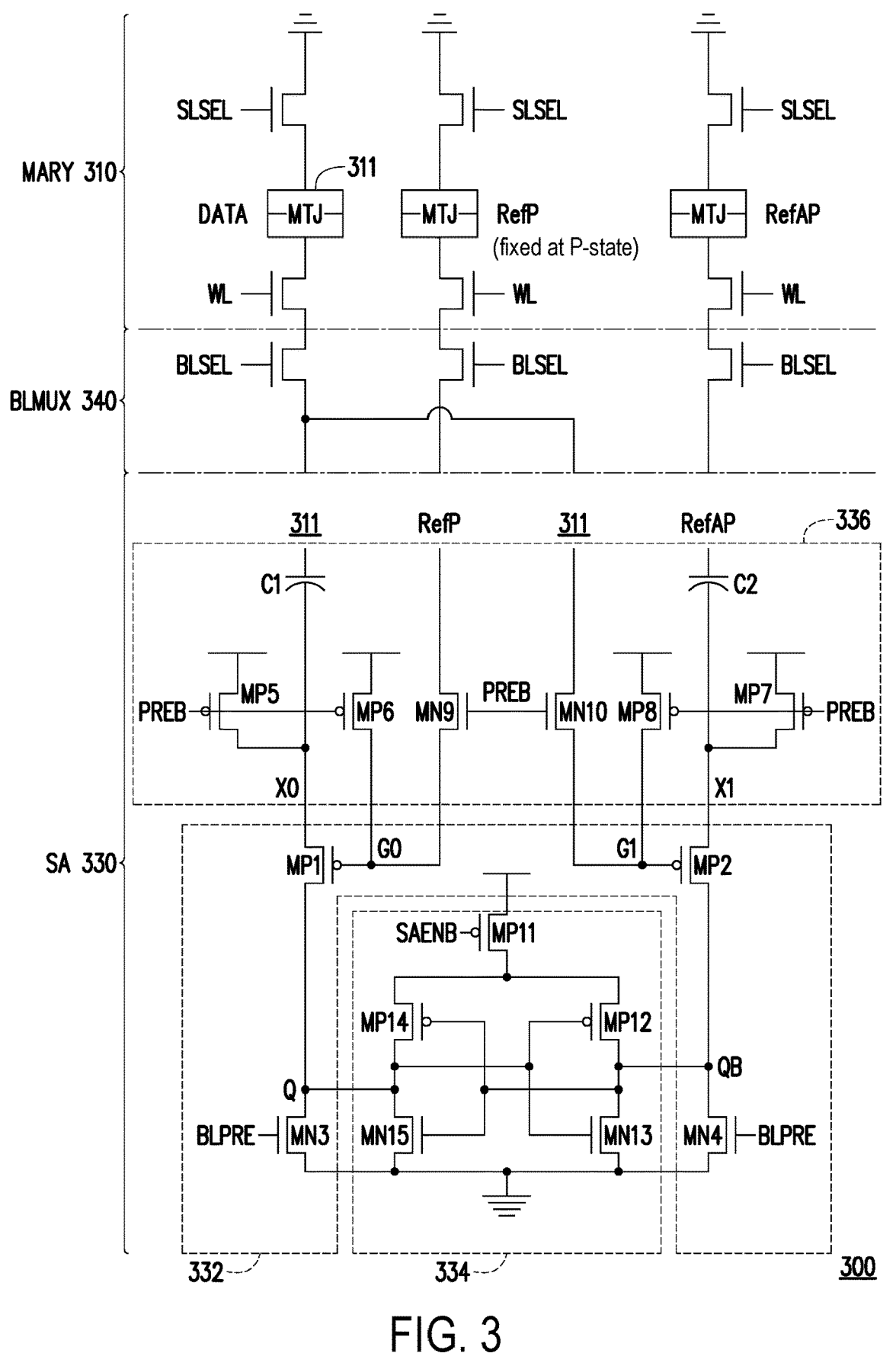

FIG. 3 illustrates the memory device 300 according to some embodiments of the present disclosure. The memory device 300 presents detail circuits of the memory array MARY 310, the bit line multiplexer BLMUX 340, and the sensing amplifier SA 330. Some circuits are not shown in the memory device 300.

The memory array MARY 310 includes a data cell 311, a first reference cell RefP with the first state (e.g., the P state of ST MRAM cell), and a second reference cell RefAP with the second state (e.g., the AP state of ST MRAM cell). In the embodiment, the first reference cell RefP is fixed at the P state and the second reference cell RefAP is fixed at the AP state for generating the dual state reference voltages (e.g., two state reference voltages). The memory array MARY 310 further includes select transistors which control nodes thereof coupled to a select signal SLSEL and transmission transistors which control nodes thereof coupled to a word line WL. The bit line multiplexer BLMUX 340 includes switches which control nodes thereof coupled to a bit line selection signal BLSEL.

For read operation of the memory device 300, the control circuit provides the select signal SLSEL, the word line WL, and the bit line selection signal BLSEL to make the data cell 311, the first reference cell RefP, and the second reference cell RefAP coupled to the sensing amplifier SA 330 through the switches of the bit line multiplexer BLMUX 340.

The sensing amplifier SA 330 in the embodiment includes a sampling circuit 332, a latch circuit 334, and a reset circuit 336.

The sampling circuit 332 has a first sampling node X0, a second sampling node G1, a first state reference node G0 coupling to the first reference cell RefP to receive a first state reference voltage through a nineth transistor MN9, a second state reference node X1 coupling to the second reference cell RefAP to receive a second state reference voltage, an output node Q and an inverted output node QB. The first sampling node X0 and the second sampling node G1 are coupled to the data cell 311 respectively through a first capacitor C1 and a tenth transistor Mn10. The sampling circuit 332 obtains a data voltage of the data cell 311, the first state reference voltage, and the second state reference voltage according to a bit line pre-charge signal and a standby signal, and the sampling circuit compares the data voltage, the first state reference voltage, and the second state reference voltage according to the bit line pre-charge signal BLPRE and a word line WL to generate a first sampling signal on the output node Q and a second sampling signal on the inverted output node QB.

In detail, the sampling circuit 332 includes a first transistor MP1, a second transistor MP2, a third transistor MN3, and fourth transistor MN4. A first node of the first transistor MP1 is coupled to the first sampling node X0, and a control node of the first transistor MP1 is coupled to the first state reference node G0. A first node of the second transistor MP2 is coupled to the second state reference node X1, and a control node of the first transistor MP2 is coupled to the second sampling node G1. A first node of the third transistor MN3 is coupled to a second node of the first transistor MP1 and the output node Q. A first node of the fourth transistor MN4 is coupled to a second node of the second transistor MP2 and the inverted output node QB, and control nodes of the third transistor MN3 and the fourth transistor MN4 receive the bit line pre-charge signal BLPRE. The second nodes of the third transistor MN3 and the fourth transistor MN4 are coupled to a ground terminal. The first transistor MP1 and the second transistor MP2 are p-type transistors, and the third transistor MN3 and the fourth transistor MN4 are n-type transistors.

The latch circuit 334 is coupled to the sampling circuit 332. The latch circuit 334 implements that the first sampling signal and the second sampling signal are inverted signals and latches the first sampling signal on the output node Q and the second sampling signal on the inverted output node QB.

In detail, the latch circuit 334 includes a first inverter, a second inverter, and an eleventh transistor MP11. An input node of the first inverter is coupled to the output node Q of the sampling circuit 332, and an output node of the first inverter is coupled to the inverted output node QB of the sampling circuit 332. An input node of the second inverter is coupled to the inverted output node QB of the sampling circuit 332, and an output node of the second inverter is coupled to the output node Q of the sampling circuit 332. A first node of the eleventh transistor MP11 is coupled to the system voltage terminal, a second node of the eleventh transistor MP11 is coupled to the first inverter and the second inverter, and a control node of the eleventh transistor MP11 receives a latch enable signal SAENB.

The first inverter is formed by a twelfth transistor MP12 and a thirteenth transistor MN13. A first node of the twelfth transistor MP12 is coupled to the second node of the eleventh transistor MP11, and a control node of the twelfth transistor MP12 is coupled to the output node Q of the sampling circuit 332. A first node of the thirteenth transistor MN13 is coupled to a second node of the twelfth transistor MP12 and the inverted output node QB of the sampling circuit 332, a second node of the thirteenth transistor MN13 is coupled to the ground terminal, and a control node of the thirteenth transistor MN13 is coupled to the output node Q of the sampling circuit 332.

The second inverter is formed by a fourteenth transistor MP14 and fifteenth transistor MN15. A first node of the fourteenth transistor MP14 is coupled to the second node of the eleventh transistor MP11, and a control node of the fourteenth transistor MP14 is coupled to the inverted output node QB of the sampling circuit 332. A first node of the fifteenth transistor MN15 is coupled to a second node of the fourteenth transistor MP14 and the output node Q of the sampling circuit 332, a second node of the fifteenth transistor MN15 is coupled to the ground terminal, and a control node of the fifteenth transistor MN15 is coupled to the inverted output node QB of the sampling circuit 332.

The reset circuit 336 is coupled to the sampling circuit 332. The reset circuit 336 resets the first sampling node X0, the second sampling node G1, the first state reference node G0, and the second state reference node X1 as a preset voltage (e.g., a system voltage) according to a standby signal PREB.

In detail, the reset circuit 336 includes a fifth transistor MP5, a sixth transistor MP6, a seventh transistor MP7, an eighth transistor MP8, a nineth transistor MN9, and a tenth transistor MN10. A first node of the fifth transistor MP5 is coupled to a system voltage terminal with the preset voltage, a second node of the fifth transistor MP5 is coupled to the first sampling node X0, and the control node of the fifth transistor MP5 is coupled to the standby signal PREB. A first node of the sixth transistor MP6 is coupled to the system voltage terminal, a second node of the sixth transistor MP6 is coupled to the first state reference node G0, and the control node of the sixth transistor MP6 is coupled to the standby signal PREB. A first node of the seventh transistor MP7 is coupled to the system voltage terminal, a second node of the seventh transistor MP7 is coupled to the second state reference node X1, and the control node of the seventh transistor MP7 is coupled to the standby signal PREB. A first node of the eighth transistor MP8 is coupled to the system voltage terminal, a second node of the eighth transistor MP8 is coupled to the second sampling node G1, and the control node of the eighth transistor MP8 is coupled to the standby signal PREB.

A first node of the nineth transistor MN9 is coupled to the first reference cell RefP of the memory array MARY 310, a second node of the nineth transistor MN9 is coupled to the first state reference node G0, and a control node of the nineth transistor MN9 is coupled to the standby signal PREB. A first node of the tenth transistor MN10 is coupled to the data cell 311 of the memory array MARY 310, a second node of the tenth transistor MN10 is coupled to the second sampling node G1, and a control node of the tenth transistor MN10 is coupled to the standby signal PREB. The fifth transistor MP5 to the eighth transistor MP8 are p-type transistors, and the nineth transistor MN9 and the tenth transistor MN10 are n-type transistors.

The reset circuit 336 further includes the first capacitance C1 and a second capacitance C2. A first node of the first capacitance C1 is coupled to the data cell 311 of the memory array MARY 310, and a second node of the first capacitance C1 is coupled to the first sampling node X0. A first node of the second capacitance C2 is coupled to the second reference cell RefAP of the memory array MARY 310, and a second node of the second capacitance C2 is coupled to the second state reference node X1.

The sampling circuit 332 of FIG. 3 uses 15 transistors and 2 capacitors for implementing the embodiment of the present disclosure. The sampling circuit 332 of FIG. 3 does not need extra scheme to generate a mid-point reference voltage (e.g., the reference voltages Vref, Vref shown in FIG. 2, uses the difference between threshold voltages of the transistors MP1 and MP2 to make threshold voltage offset suppression, and uses dual state reference voltages (e.g., two state reference voltages) for distinguish the states of the STT MRAM cells for enhance the read signal margin.

The operations of the sampling circuit 332 in FIG. 3 are illustrated in FIGS. 4A-11A and FIGS. 4B-11B. FIGS. 4A-7A and FIGS. 4B-7B illustrate circuit operations of the sampling circuit 332 in FIG. 3 and waveform diagrams of signals the sampling circuit 332 while the state of the data cell 331 is the P state according to some embodiments of the present disclosure.

Figure 4A:
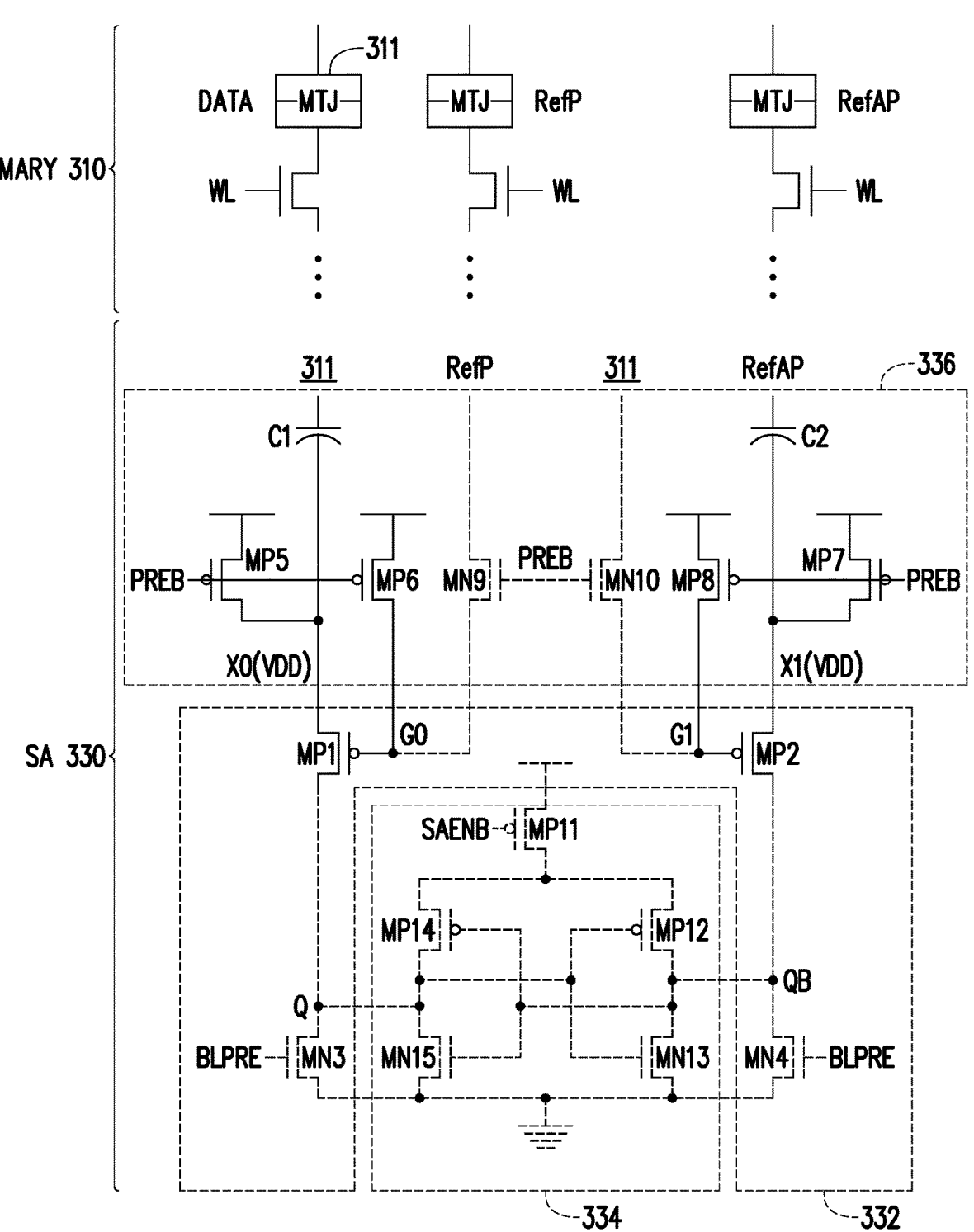
Figure 4B:
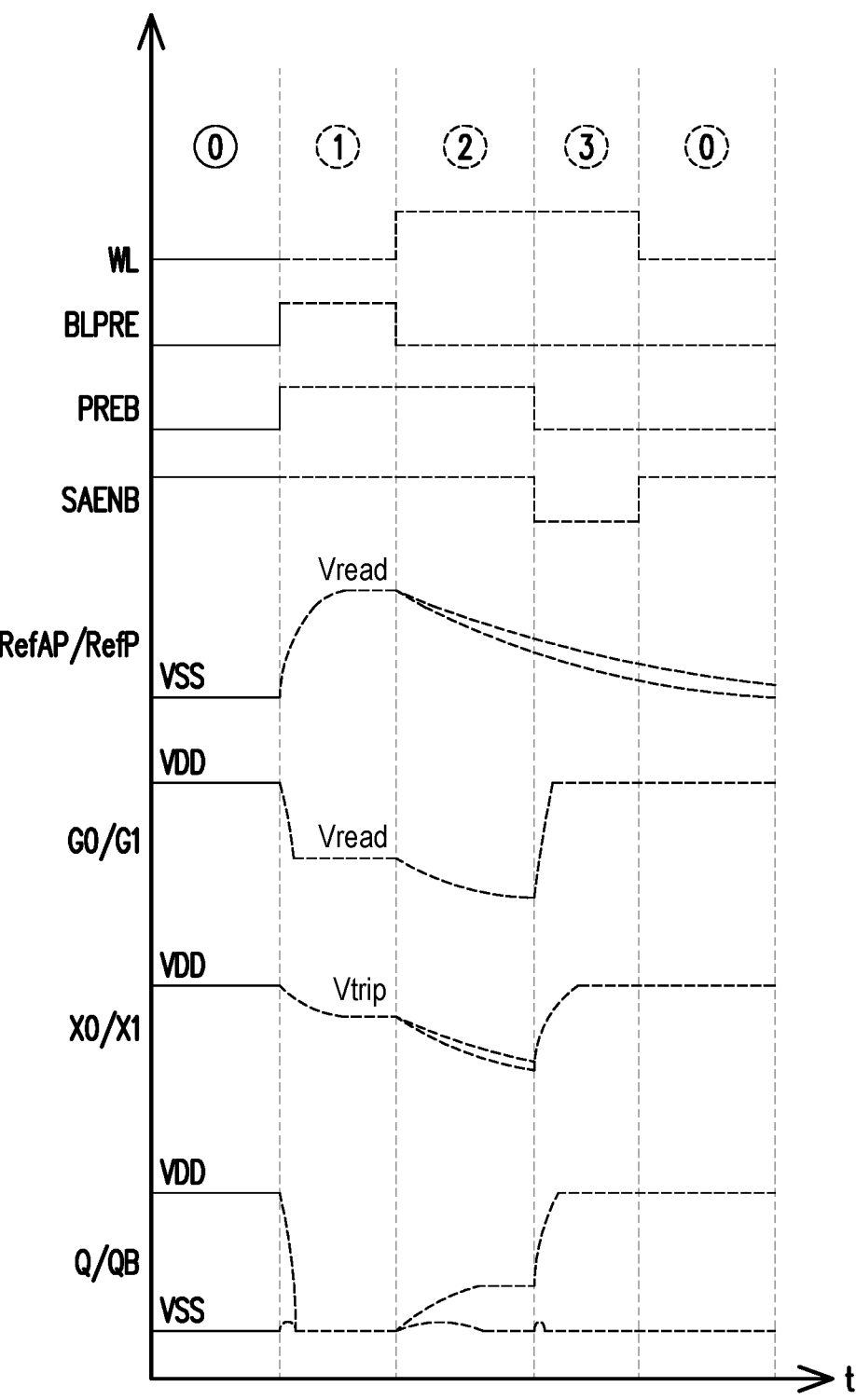

During phase 0 (standby phase) in the read operation of the sampling circuit 332 shown in FIGS. 4A and 4B, the word line WL, the bit line pre-charge signal BLPRE, and the standby signal PREB are all logic 0 and the latch enable signal SAENB are logic 1. In this situation, the fifth to eighth transistors MP5-MP8 are turned-on and the nineth to tenth transistors MN9-MN10 are turned-off. Thus, voltages of the first and the second sampling nodes X0 and G1 and the first and the second state reference nodes G0 and X1 are the system voltage VDD, one of the output node Q and the inverted output node QB are initial to the system voltage VDD and the other one the output node Q and the inverted output node QB is the ground voltage VSS.

Figure 5A:
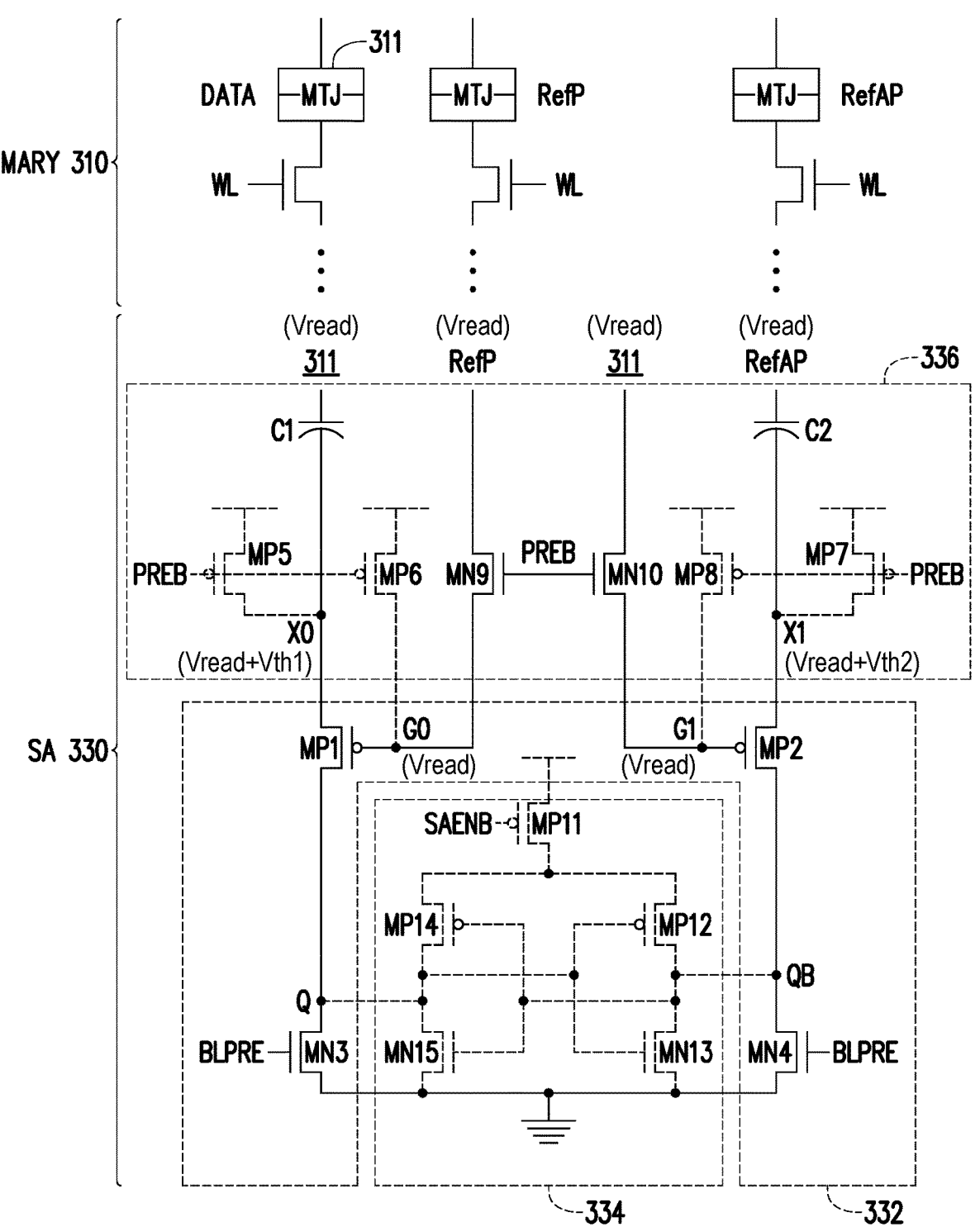
Figure 5B:
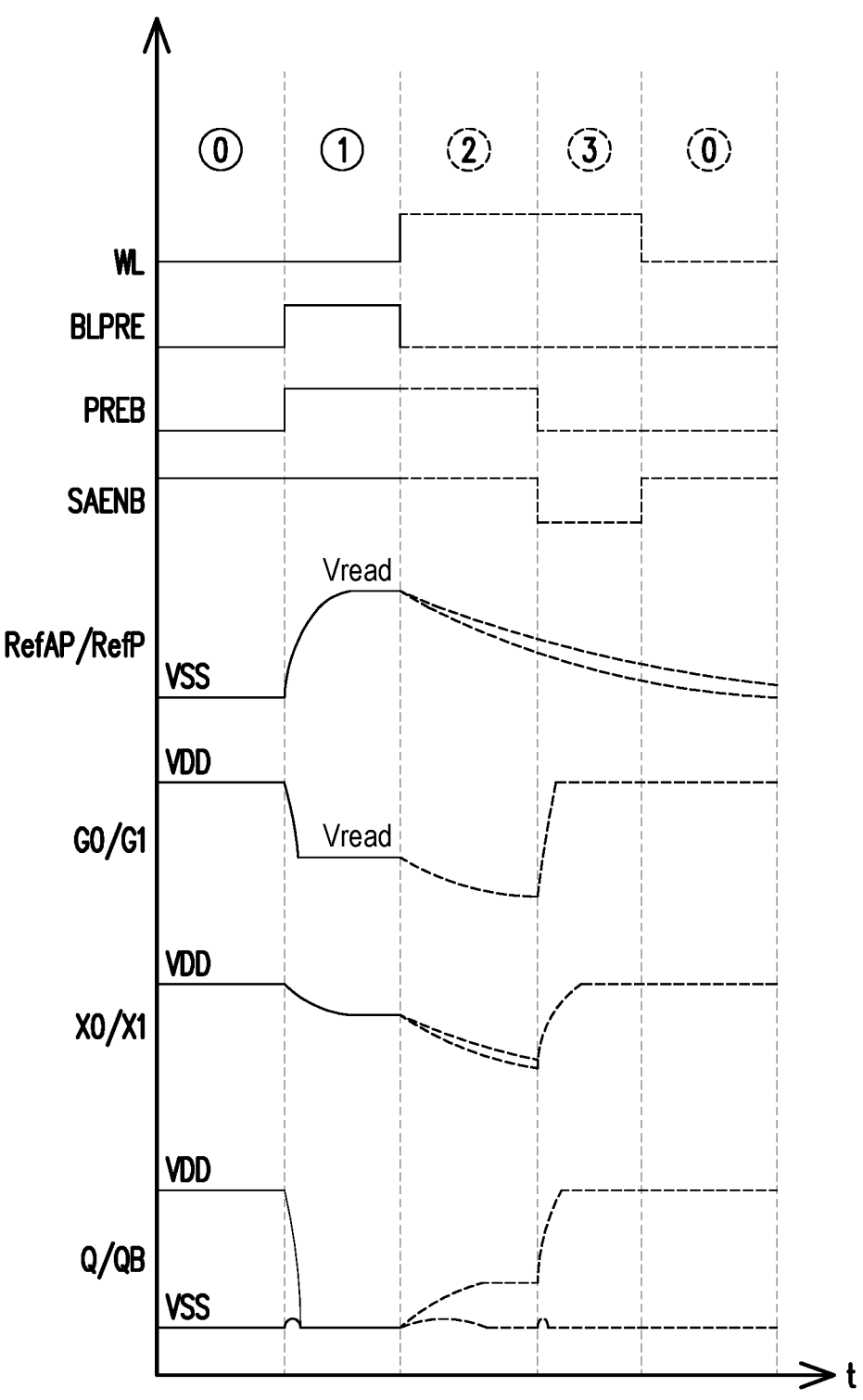

During phase 1 (sampling and pre-charge phase) in the read operation of the sampling circuit 332 shown in FIGS. 5A and 5B, the bit line pre-charge signal BLPRE and the standby signal PREB are changed to logic 1 from logic 0. The nodes connected to the data cell 311, the first reference cell RefP, and the second reference cell RefAP are pre-charged as the read voltage Vread. And, the third to fourth transistors MP3-MP4, the nineth to tenth transistors MN9-MN10 are turned-on. Thus, the voltages of the output node Q and the inverted output node QB are the ground voltage VSS, and voltages of the first state reference node G0 and the second sampling node G1 are the read voltage Vread. The voltage of the first sampling nodes X0 is a total voltage of the read voltage Vread plus the threshold voltage Vth1 of the first transistor MP1. And, the voltage of the second state reference node X1 is a total voltage of the read voltage Vread plus the threshold voltage Vth2 of the second transistor MP2.

Figure 6A:
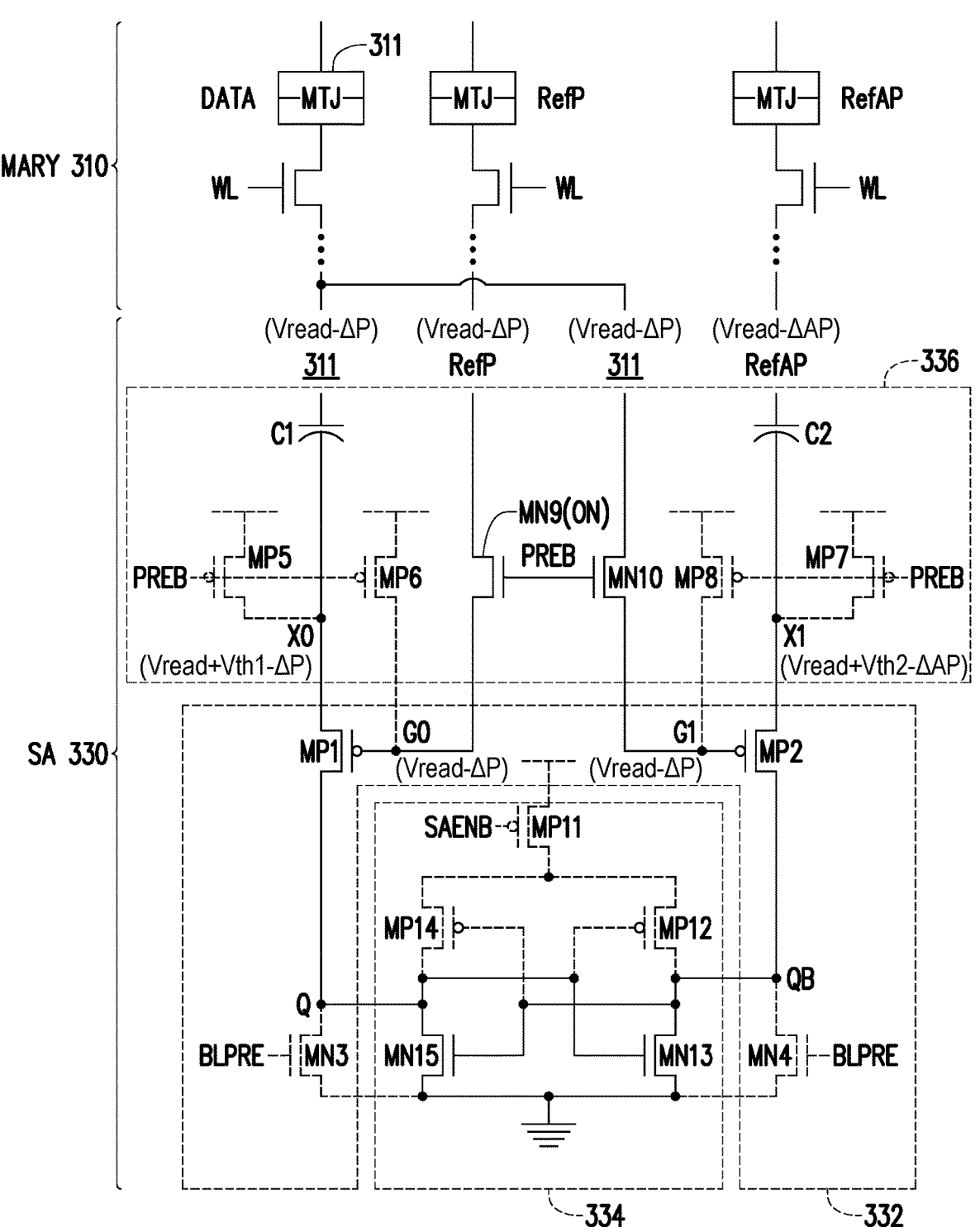
Figure 6B:
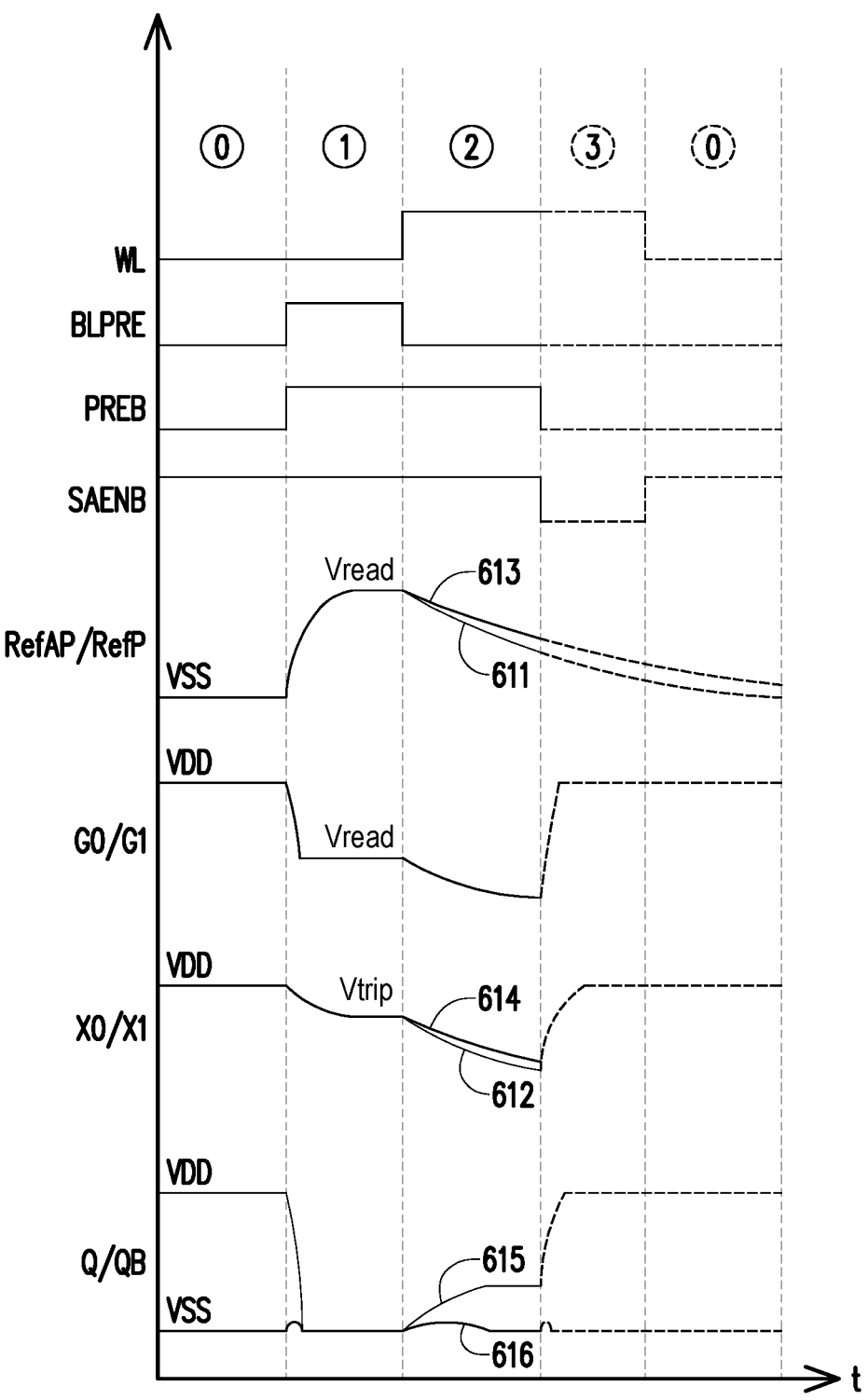

During phase 2 (developing and margin enhancement phase) in the read operation of the sampling circuit 332 shown in FIGS. 6A and 6B, the word line WL is changed to logic 1 from logic 0, and the bit line pre-charge signal BLPRE is changed to logic 0 from logic 1. While the state of the data cell 311 is the P state, the voltages of the first sampling node X0, the first state reference node G0, and the second sampling node G1 are a total voltage of the read voltage Vread minus the voltage difference ΔP. The nodes connected to the data cell 311 and the first state reference cell RefP have a total voltage of the read voltage Vread minus the voltage difference ΔP (shown as the curve 611 of FIG. 6B). The voltage of the first state reference node G0 is a total voltage of the read voltage Vread minus the voltage difference ΔP. The voltage of the second sampling node G1 is a total voltage of the read voltage Vread minus the voltage difference ΔP. The voltage of the first sampling node X0 is a total voltage of the read voltage Vread plus the threshold voltage Vth1 of the first transistor MP1 further minus the voltage difference ΔP (shown as the curve 612 of FIG. 6B).

The node connected to the second state reference cell RefAP has a total voltage of the read voltage Vread minus the voltage difference ΔAP (shown as the curve 613 of FIG. 6B). The voltage of the second state reference node X1 is a total voltage of the read voltage Vread plus the threshold voltage Vth2 of the second transistor MP2 further minus the voltage difference ΔAP (shown as the curve 614 of FIG. 6B). The absolute value of the voltage difference ΔP is larger than the absolute value of the voltage difference ΔAP. Thus, the voltage of the output node Q (shown as the curve 615 of FIG. 6B) is larger than the voltage of the inverted output node QB (shown as the curve 616 of FIG. 6B).

Figure 7A:
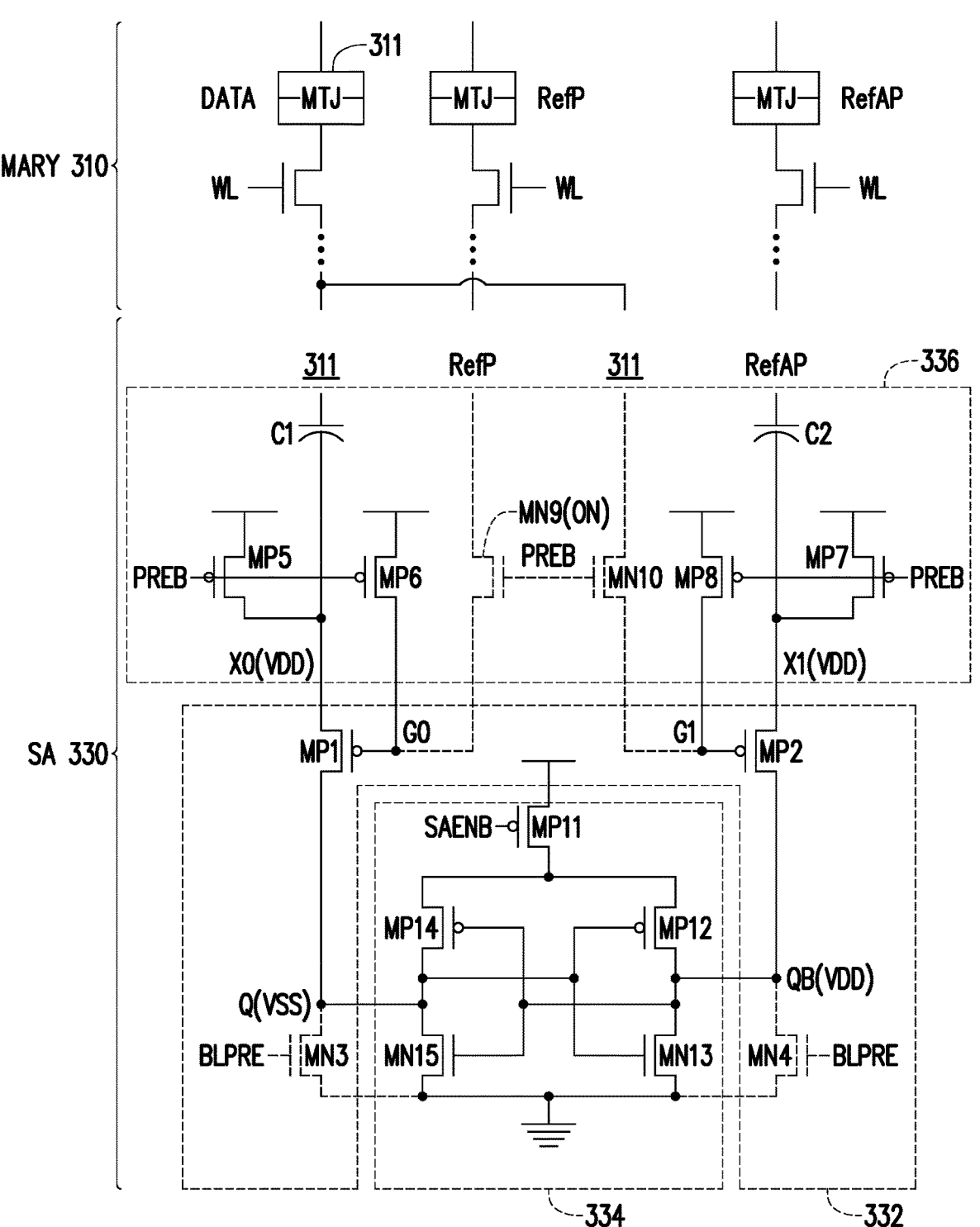
Figure 7B:
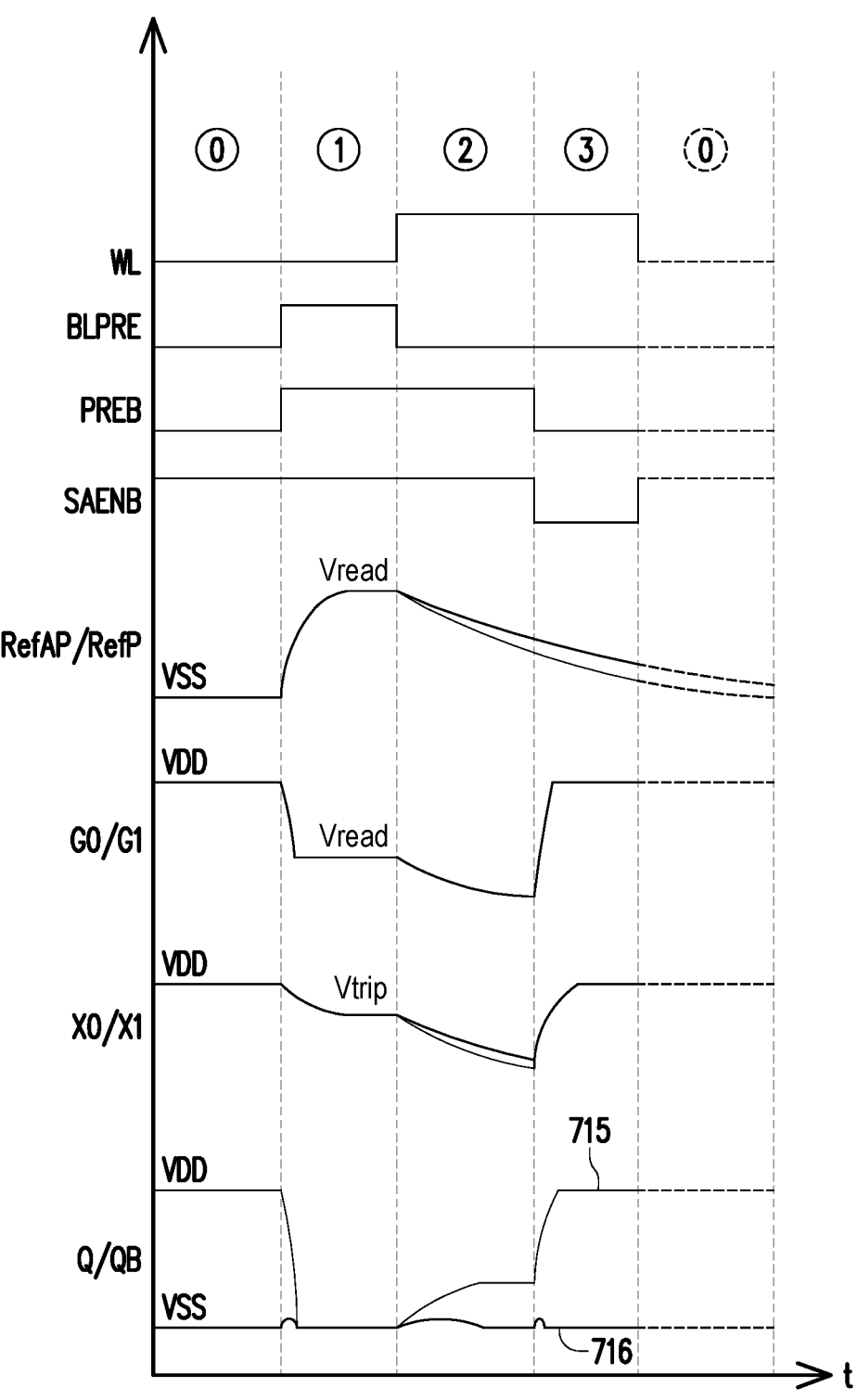

During phase 3 (latch phase) in the read operation of the sampling circuit 332 shown in FIGS. 7A and 7B, the word line WL is changed to logic 0 from logic 1, the standby signal PREB and the latch enable signal SAENB are changed to logic 0 from logic 1, thus the latch enable signal SAENB is enabled. The latch circuit 332 of FIG. 7A implements that the first sampling signal on the output node Q (shown as curves 715) and the second sampling signal on the inverted output node QB (shown as curves 716) are inverted signals. And, the latch circuit 332 latches the first sampling signal on the output node Q and the second sampling signal on the inverted output node QB. After the phase 3, the word line WL is changed to logic 0 from logic 1, the latch enable signal SAENB is changed to logic 1 from logic 0 for disabling the latch circuit 332, and the phase 0 in the read operation is performed successively.

FIGS. 8A-11A and FIGS. 8B-11B illustrate circuit operations of the sampling circuit 332 in FIG. 3 and waveform diagrams of signals the sampling circuit 332 while the state of the data cell 331 is the AP state according to some embodiments of the present disclosure.

Figure 8A:
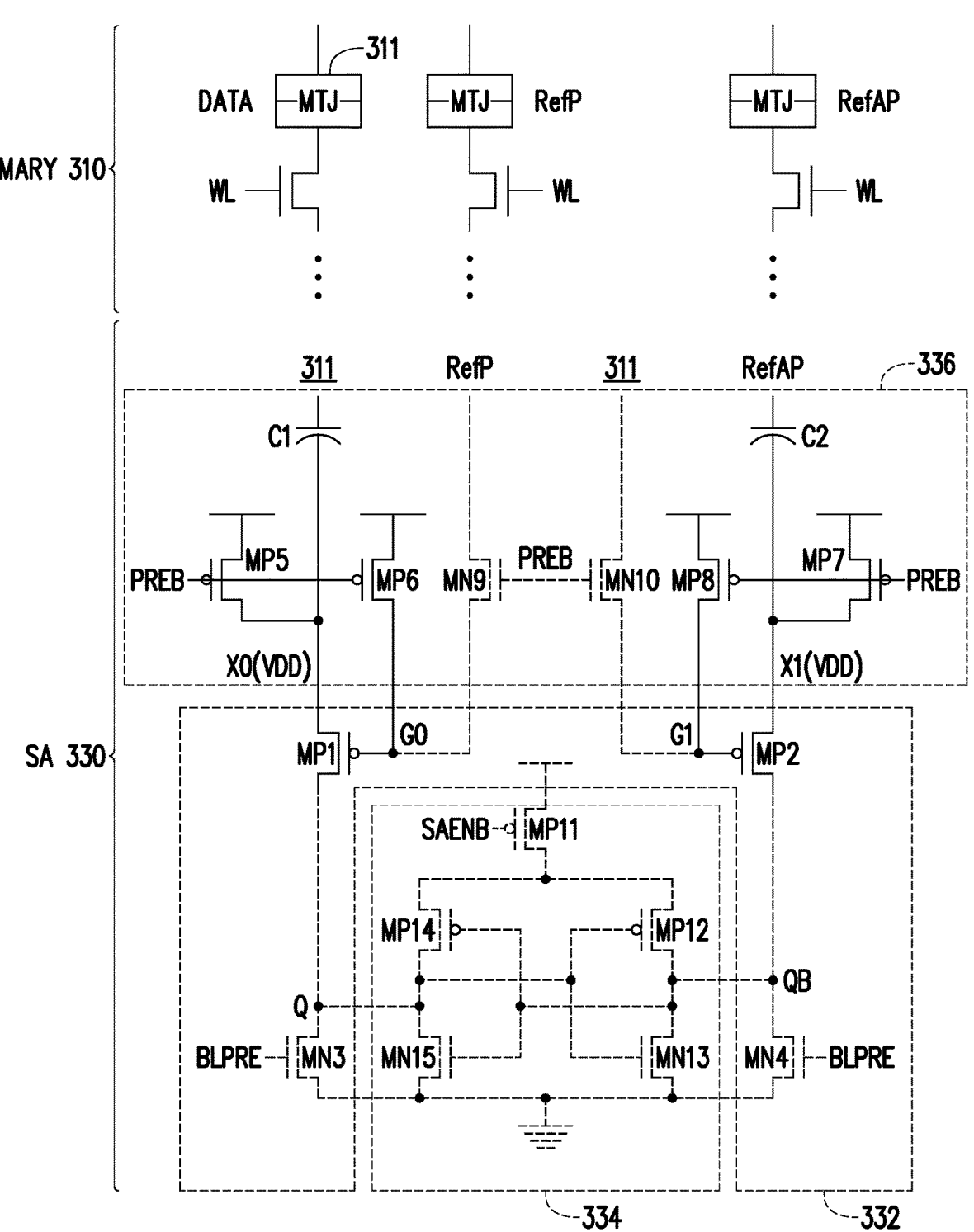
Figure 8B:
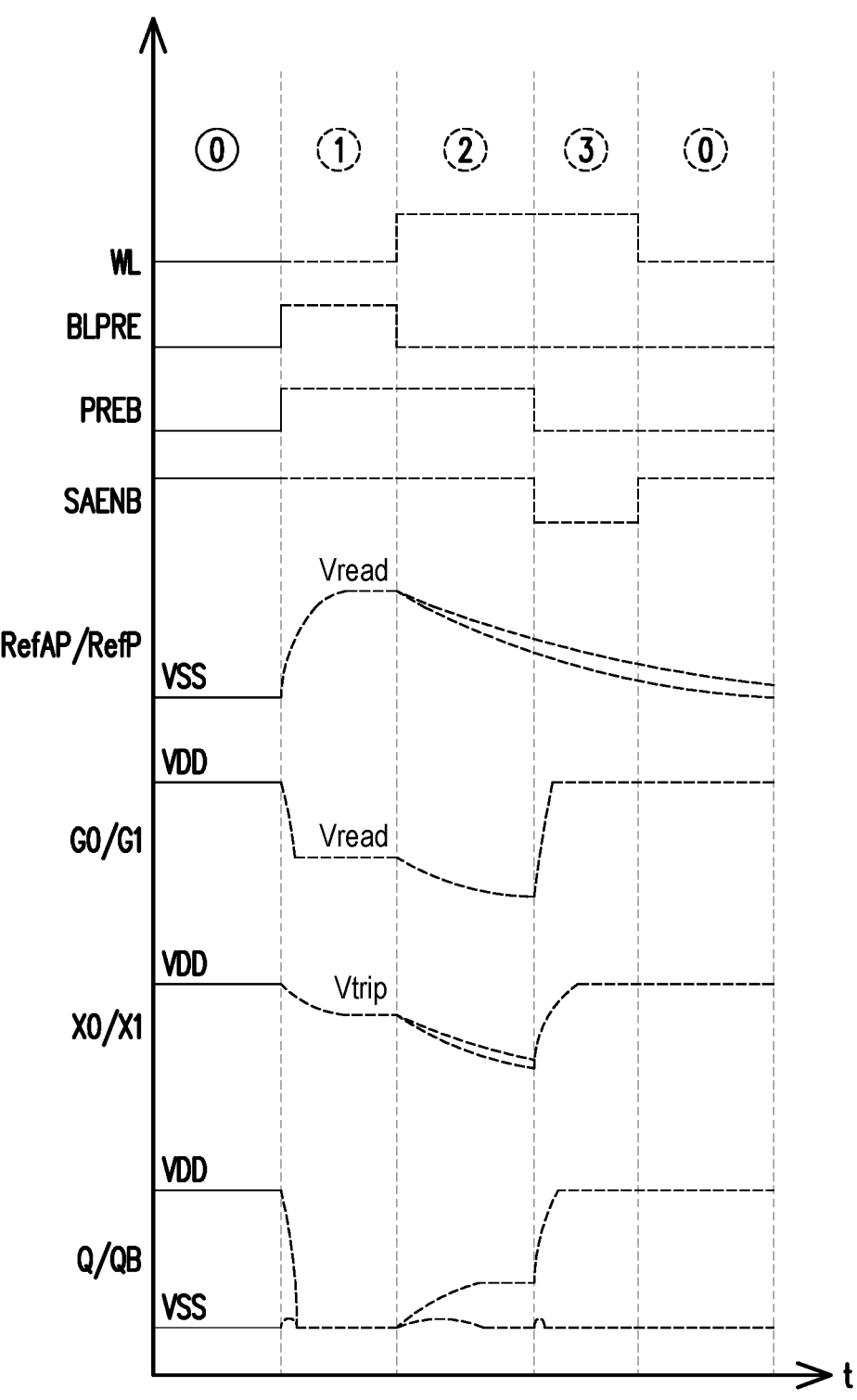

During phase 0 (standby phase) in the read operation of the sampling circuit 332 shown in FIGS. 8A and 8B, the word line WL, the bit line pre-charge signal BLPRE, and the standby signal PREB are all logic 0 and the latch enable signal SAENB are logic 1. In this situation, the fifth to eighth transistors MP5-MP8 are turned-on and the nineth to tenth transistors MN9-MN10 are turned-off. Thus, voltages of the first and the second sampling nodes X0 and G1 and the first and the second state reference nodes G0 and X1 are the system voltage VDD, one of the output node Q and the inverted output node QB are initial to the system voltage VDD and the other one the output node Q and the inverted output node QB is the ground voltage VSS.

Figure 9A:
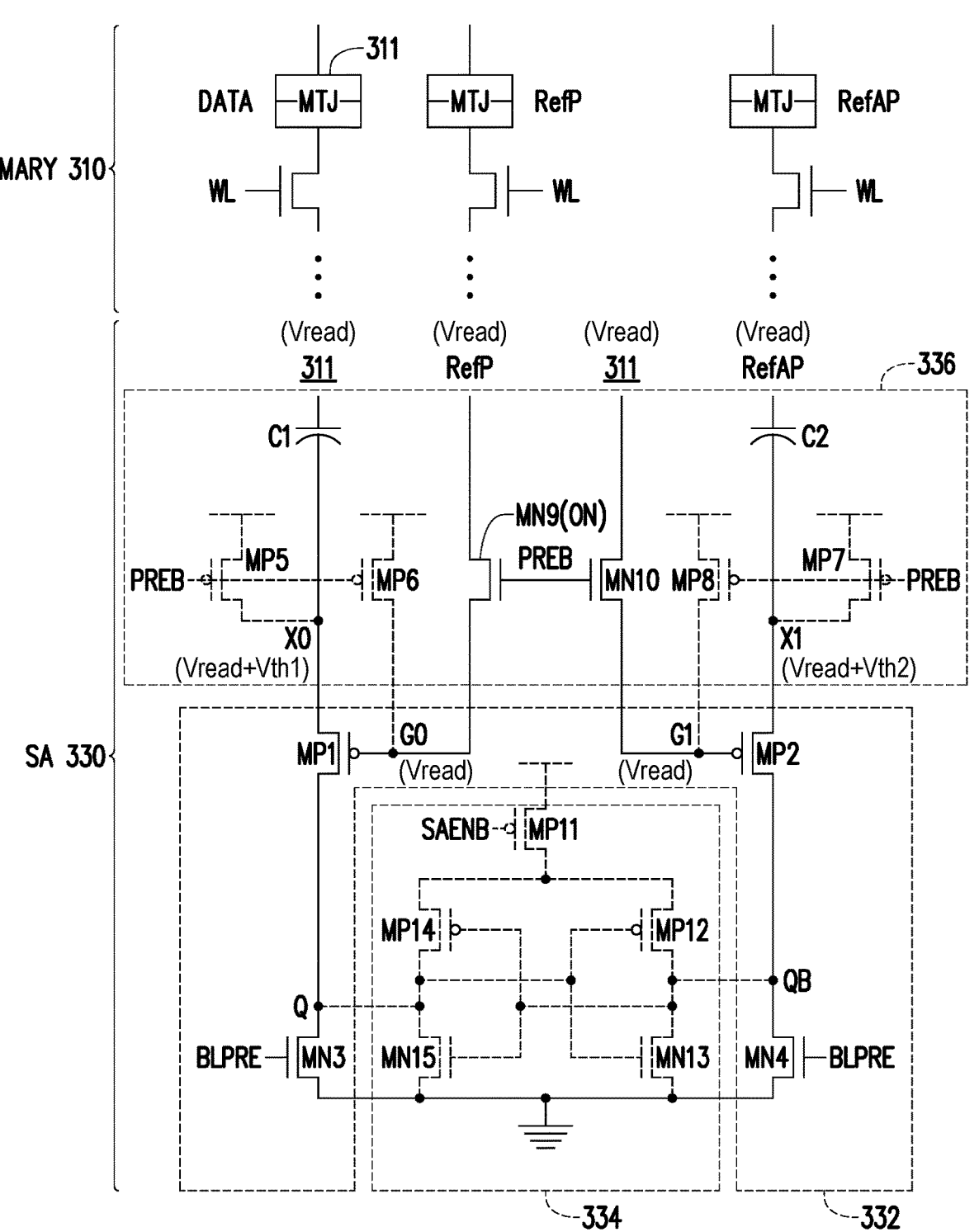
Figure 9B:
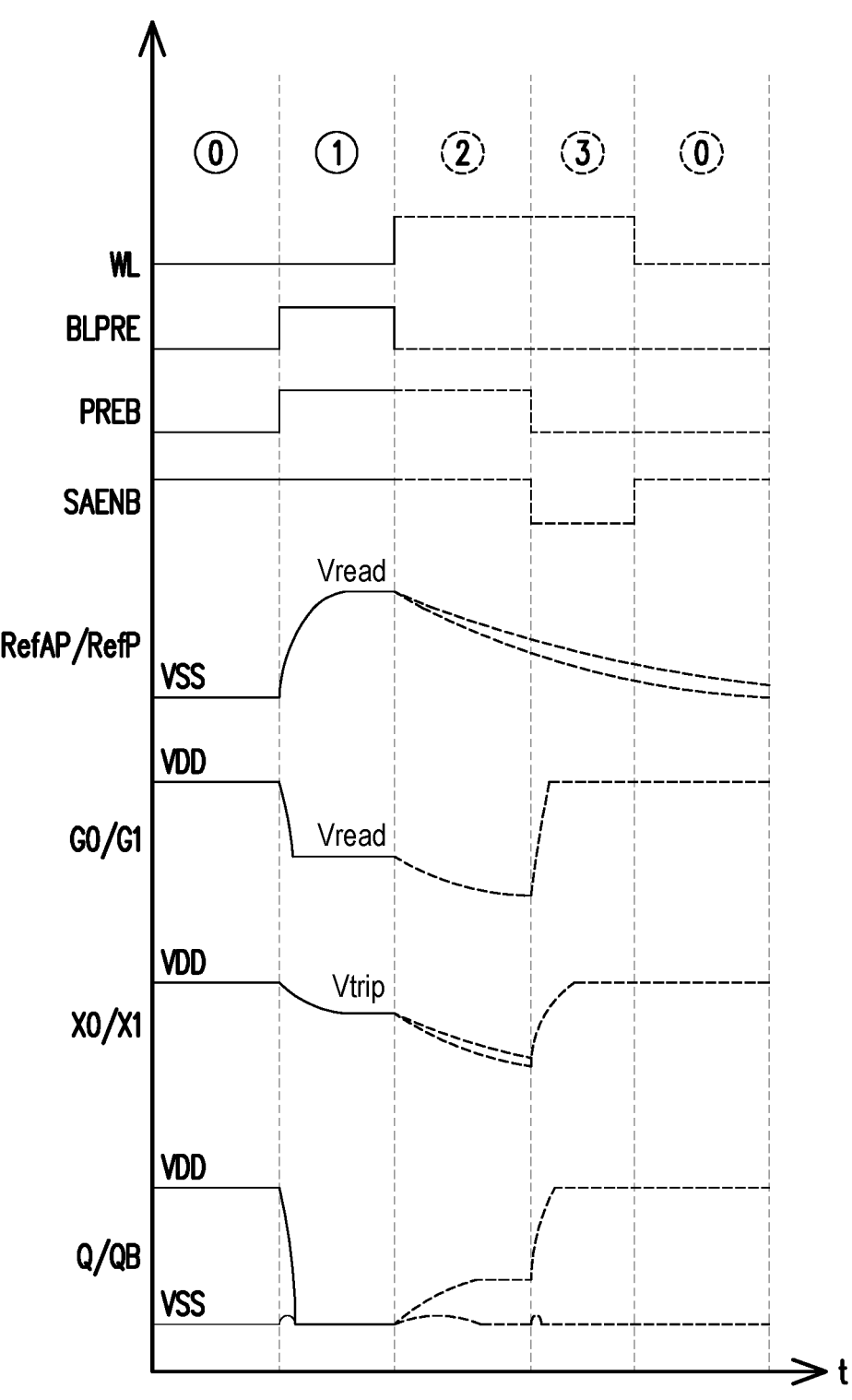

During phase 1 (sampling and pre-charge phase) in the read operation of the sampling circuit 332 shown in FIGS. 9A and 9B, the bit line pre-charge signal BLPRE and the standby signal PREB are changed to logic 1 from logic 0. The nodes connected to the data cell 311, the first reference cell RefP, and the second reference cell RefAP are pre-charged as the read voltage Vread. And, the third to fourth transistors MP3-MP4, the nineth to tenth transistors MN9-MN10 are turned-on. Thus, the voltages of the output node Q and the inverted output node QB are the ground voltage VSS, and voltages of the first state reference node G0 and the second sampling node G1 are the read voltage Vread. The voltage of the first sampling nodes X0 is a total voltage of the read voltage Vread plus the threshold voltage Vth1 of the first transistor MP1. And, the voltage of the second state reference node X1 is a total voltage of the read voltage Vread plus the threshold voltage Vth2 of the second transistor MP2.

Figure 10A:
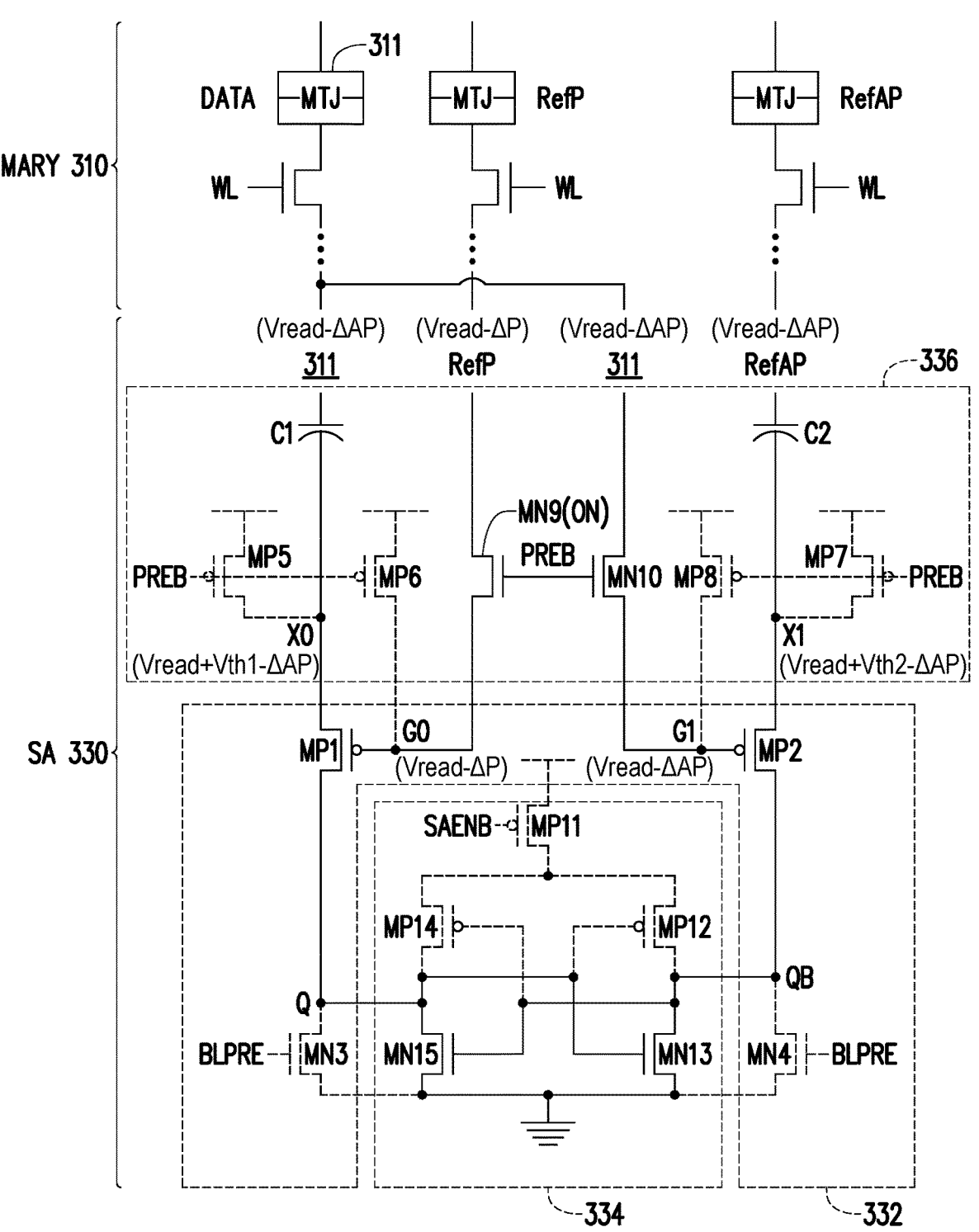
Figure 10B:
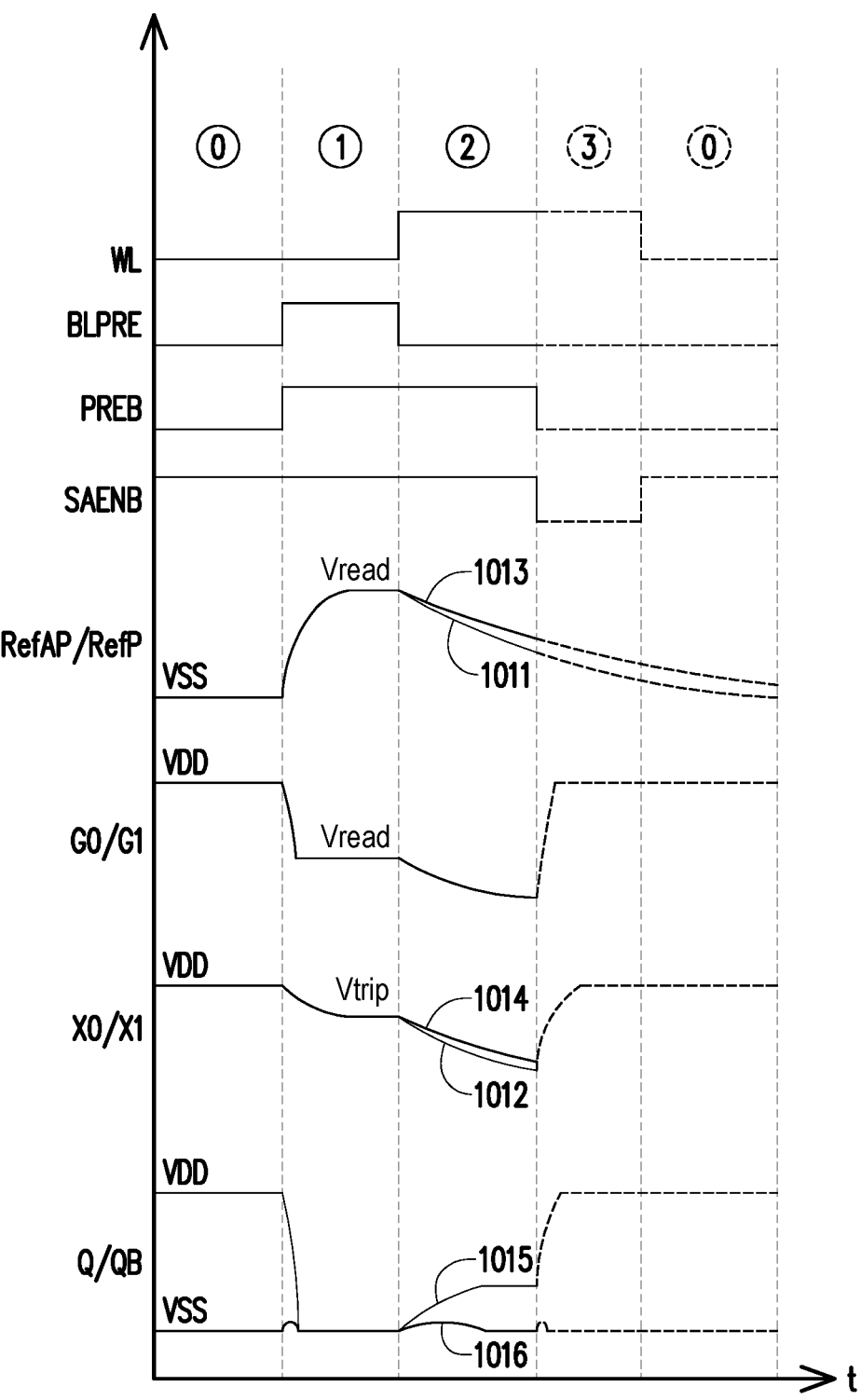

During phase 2 (developing and margin enhancement phase) in the read operation of the sampling circuit 332 shown in FIGS. 10A and 10B, the word line WL is changed to logic 1 from logic 0, and the bit line pre-charge signal BLPRE is changed to logic 0 from logic 1. While the state of the data cell 311 is the AP state, the voltages of the first sampling node X0, the second sampling node G1, and the second state reference node X1 are a total voltage of the read voltage Vread minus the voltage difference ΔAP (shown as the curve 1012 of FIG. 10B). The nodes connected to the data cell 311 and the second state reference cell RefAP have a total voltage of the read voltage Vread minus the voltage difference ΔAP (shown as the curve 1013 of FIG. 10B). The voltage of the second sampling node G1 is a total voltage of the read voltage Vread minus the voltage difference ΔAP.

The node connected to the first state reference cell RefP have a total voltage of the read voltage Vread minus the voltage difference ΔP (shown as the curve 1011 of FIG. 10B). The voltage of the first state reference node G0 is a total voltage of the read voltage Vread minus the voltage difference ΔP (shown as the curve 1014 of FIG. 10B). The absolute value of the voltage difference ΔP is larger than the absolute value of the voltage difference ΔAP. Thus, the voltage of the output node Q (shown as the curve 1016 of FIG. 10B) is smaller than the voltage of the inverted output node QB (shown as the curve 1015 of FIG. 10B).

Figure 11A:
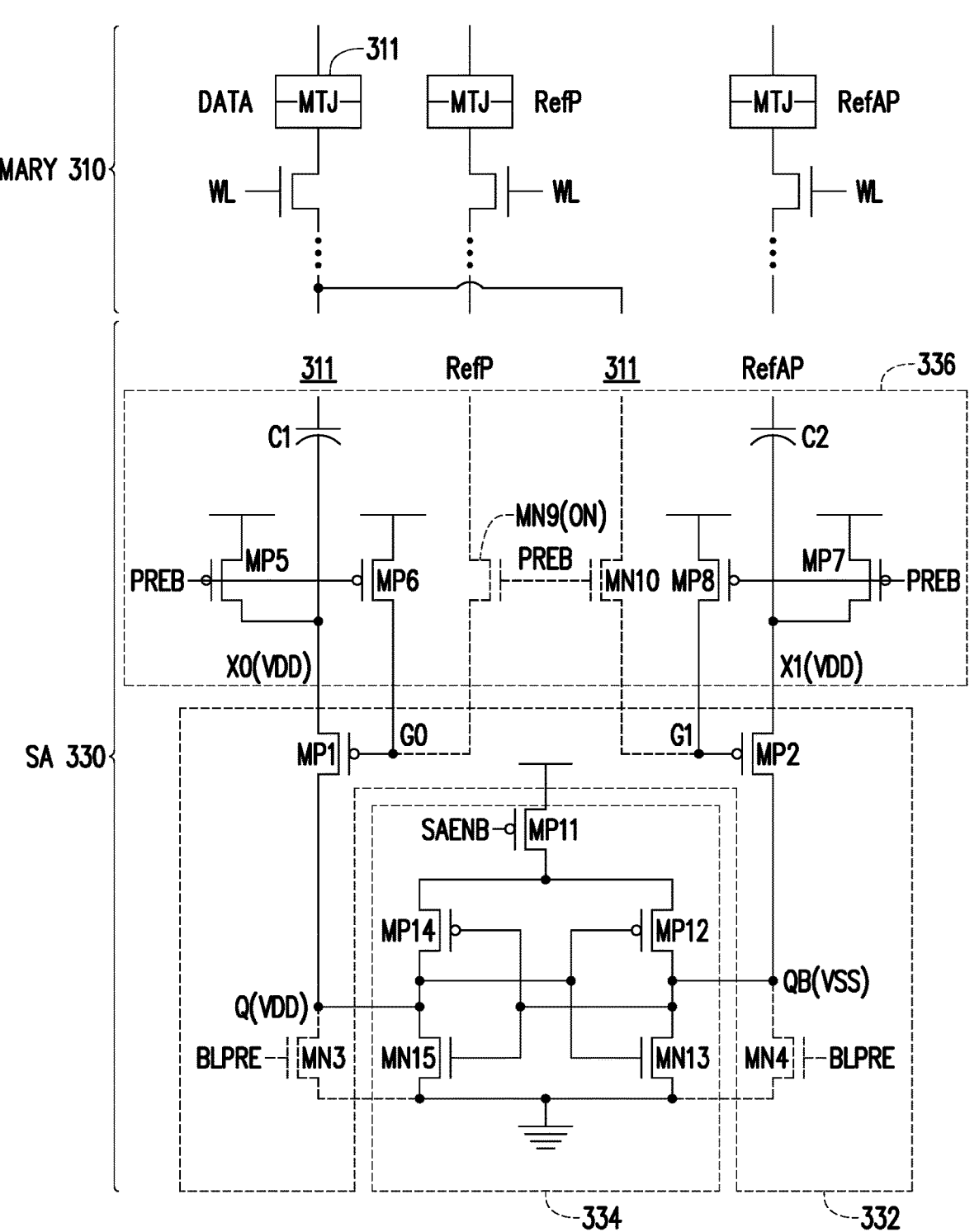
Figure 11B:
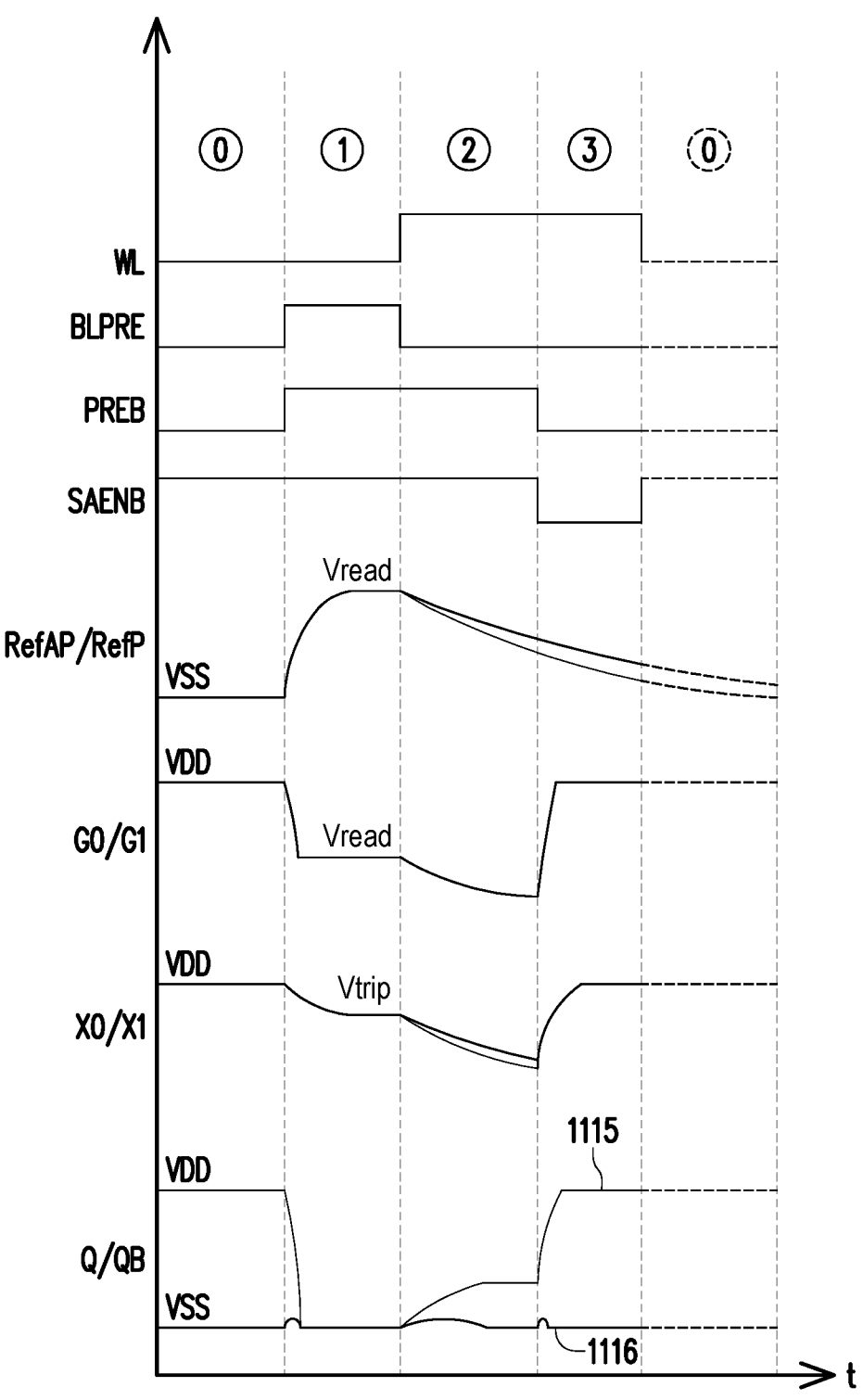

During phase 3 (latch phase) in the read operation of the sampling circuit 332 shown in FIGS. 11A and 11B, the word line WL is changed to logic 0 from logic 1, the standby signal PREB and the latch enable signal SAENB are changed to logic 0 from logic 1, thus the latch enable signal SAENB is enabled. The latch circuit 332 of FIG. 11A implements that the first sampling signal on the output node Q (shown as curves 1116) and the second sampling signal on the inverted output node QB (shown as curves 1115) are inverted signals. And, the latch circuit 332 latches the first sampling signal on the output node Q and the second sampling signal on the inverted output node QB. After the phase 3, the word line WL is changed to logic 0 from logic 1, the latch enable signal SAENB is changed to logic 1 from logic 0 for disabling the latch circuit 332, and the phase 0 in the read operation is performed successively.

FIG. 12 illustrates a flow chart of a data read method of a memory array according to some embodiments of the present disclosure. The operating method may be applied and executed by the memory device 300 in FIG. 3. The operating method includes steps S1210-1240. In step S1210, a first sampling node X0, a second sampling node G1, a first state reference node G0, and a second state reference node X1 of a sampling circuit 320 in a sensing amplifier SA 330 are reset as a preset voltage (e.g., the system voltage VDD) according to a standby signal PREB.

In step S1220, a data voltage of the data cell 311 on the first sampling node X0 and the second sampling node G1 of the sampling circuit are obtained, a first state reference voltage of the sampling circuit 332 are obtained according to the first reference cell RefP, and a second state reference voltage according to the second reference cell RefAP on the second state reference node X1 of the sampling circuit 332 are obtained according to a bit line pre-charge signal BLPRE and the standby signal PREB.

In step S1230, the data voltage, the first state reference voltage, and the second state reference voltage are compared according to the bit line pre-charge signal BLPRE and a word line WL to generate a first sampling signal on the output node Q and a second sampling signal on the inverted output node QB by the sampling circuit 332 in the sensing amplifier SA 330. In step S1240, the first sampling signal and the second sampling signal are inverted signals are implemented by a latch circuit 334 and the first sampling signal on the output node and the second sampling signal on the inverted output node ae latched by the latch circuit 334 in the sensing amplifier SA 330. The detail operations of the step S1210-1240 are reference for the above-mentioned embodiments.

In some embodiments, a sensing amplifier of a memory array comprises a sampling circuit, a latch circuit, and a reset circuit. The memory array includes a data cell, a first reference cell with a first state and a second reference cell with a second state. The sampling circuit has a first sampling node, a second sampling node, a first state reference node coupling to the first reference cell to receive a first state reference voltage, a second state reference node coupling to the second reference cell to receive a second state reference voltage, an output node and an inverted output node, wherein the first sampling node and the second sampling node are coupled to the data cell, wherein the sampling circuit obtains a data voltage of the data cell, the first state reference voltage, and the second state reference voltage according to a bit line pre-charge signal and a standby signal, and the sampling circuit compares the data voltage, the first state reference voltage, and the second state reference voltage according to the bit line pre-charge signal and a word line to generate a first sampling signal on the output node and a second sampling signal on the inverted output node. The latch circuit is coupled to the sampling circuit, wherein the latch circuit implements that the first sampling signal and the second sampling signal are inverted signals and latches the first sampling signal on the output node and the second sampling signal on the inverted output node. The reset circuit is coupled to the sampling circuit. The reset circuit resets the first sampling node, the second sampling node, the first state reference node, and the second state reference node as a preset voltage according to a standby signal.

In some embodiments, a memory device comprises a memory array and sensing amplifier. The memory array includes a data cell, a first reference cell with a first state and a second reference cell with a second state. The sensing amplifier is coupled to the memory array. The sensing amplifier comprises a sampling circuit, a latch circuit, and a reset circuit. The sampling circuit has a first sampling node, a second sampling node, a first state reference node coupling to the first reference cell to receive a first state reference voltage, a second state reference node coupling to the second reference cell to receive a second state reference voltage, an output node and an inverted output node, wherein the first sampling node and the second sampling node are coupled to the data cell, wherein the sampling circuit obtains a data voltage of the data cell, the first state reference voltage, and the second state reference voltage according to a bit line pre-charge signal and a standby signal, and the sampling circuit compares the data voltage, the first state reference voltage, and the second state reference voltage according to the bit line pre-charge signal and a word line to generate a first sampling signal on the output node and a second sampling signal on the inverted output node. The latch circuit is coupled to the sampling circuit, wherein the latch circuit implements that the first sampling signal and the second sampling signal are inverted signals and latches the first sampling signal on the output node and the second sampling signal on the inverted output node. The reset circuit is coupled to the sampling circuit. The reset circuit resets the first sampling node, the second sampling node, the first state reference node, and the second state reference node as a preset voltage according to a standby signal.

In some embodiments, a data read method of the memory array is presented. The memory array includes a data cell, a first reference cell with a first state and a second reference cell with a second state. The data read method comprising: resetting a first sampling node, a second sampling node, a first state reference node, and a second state reference node of a sampling circuit in a sensing amplifier as a preset voltage according to a standby signal; obtaining a data voltage of the data cell on the first sampling node and the second sampling node of the sampling circuit, obtaining a first state reference voltage of the sampling circuit according to the first reference cell, and obtaining a second state reference voltage according to the second reference cell on the second state reference node of the sampling circuit according to a bit line pre-charge signal and the standby signal; comparing the data voltages, the first state reference voltage, and the second state reference voltage according to the bit line pre-charge signal and a word line to generate a first sampling signal on the output node and a second sampling signal on the inverted output node by the sampling circuit in the sensing amplifier; and, implementing that the first sampling signal and the second sampling signal are inverted signals and latching the first sampling signal on the output node and the second sampling signal on the inverted output node by a latch circuit in the sensing amplifier.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A sensing amplifier of a memory array, wherein the memory array includes a data cell, a first reference cell with a first state and a second reference cell with a second state, the sensing amplifier comprising:

a sampling circuit, having a first sampling node, a second sampling node, a first state reference node coupling to the first reference cell to receive a first state reference voltage, a second state reference node coupling to the second reference cell to receive a second state reference voltage, an output node and an inverted output node, wherein the first sampling node and the second sampling node are coupled to the data cell, wherein the sampling circuit obtains a data voltage of the data cell, the first state reference voltage, and the second state reference voltage according to a bit line pre-charge signal and a standby signal, and the sampling circuit compares the data voltage, the first state reference voltage, and the second state reference voltage according to the bit line pre-charge signal and a word line to generate a first sampling signal on the output node and a second sampling signal on the inverted output node;

a latch circuit, coupled to the sampling circuit, wherein the latch circuit implements that the first sampling signal and the second sampling signal are inverted signals and latches the first sampling signal on the output node and the second sampling signal on the inverted output node; and a reset circuit, coupled to the sampling circuit, resetting the first sampling node, the second sampling node, the first state reference node, and the second state reference node as a preset voltage according to the standby signal, wherein the sampling circuit comprising:

a first transistor, wherein a first node of the first transistor is coupled to the first sampling node, a control node of the first transistor is coupled to the first state reference node;

a second transistor, wherein a first node of the second transistor is coupled to the second state reference node, a control node of the second transistor is coupled to the second sampling node;

a third transistor, wherein a first node of the third transistor is coupled to a second node of the first transistor and the output node; and a fourth transistor, wherein a first node of the fourth transistor is coupled to a second node of the second transistor and the inverted output node, control nodes of the third transistor and the fourth transistor receive the bit line pre-charge signal.

2. The sensing amplifier of claim 1, wherein the second nodes of the third transistor and the fourth transistor are coupled to a ground terminal.

3. The sensing amplifier of claim 1, wherein the first transistor and the second transistor are p-type transistors, and the third transistor and the fourth transistor are n-type transistors.

4. The sensing amplifier of claim 1, wherein the reset circuit comprising:

a fifth transistor, wherein a first node of the fifth transistor is coupled to a system voltage terminal with the preset voltage, a second node of the fifth transistor is coupled to the first sampling node, and the control node of the fifth transistor is coupled to the standby signal;

a sixth transistor, wherein a first node of the sixth transistor is coupled to the system voltage terminal, a second node of the sixth transistor is coupled to the first state reference node, and the control node of the sixth transistor is coupled to the standby signal;

a seventh transistor, wherein a first node of the seventh transistor is coupled to the system voltage terminal, a second node of the seventh transistor is coupled to the second state reference node, and the control node of the seventh transistor is coupled to the standby signal;

an eighth transistor, wherein a first node of the eighth transistor is coupled to the system voltage terminal, a second node of the eighth transistor is coupled to the second sampling node, and the control node of the eighth transistor is coupled to the standby signal;

a nineth transistor, wherein a first node of the nineth transistor is coupled to the first reference cell of the memory array, a second node of the nineth transistor is coupled to the first state reference node, and a control node of the nineth transistor is coupled to the standby signal; and a tenth transistor, wherein a first node of the tenth transistor is coupled to the data cell of the memory array, a second node of the tenth transistor is coupled to the second sampling node, and a control node of the tenth transistor is coupled to the standby signal.

5. The sensing amplifier of claim 4, wherein the fifth transistor to the eighth transistor are p-type transistors, and the nineth transistor and the tenth transistor are n-type transistors.

6. The sensing amplifier of claim 4, wherein the reset circuit further comprising:

a first capacitance, wherein a first node of the first capacitance is coupled to the data cell of the memory array, a second node of the first capacitance is coupled to the first sampling node; and a second capacitance, wherein a first node of the second capacitance is coupled to the second reference cell of the memory array, a second node of the second capacitance is coupled to the second state reference node.

7. The sensing amplifier of claim 1, wherein the latch circuit comprising:

a first inverter, wherein an input node of the first inverter is coupled to the output node of the sampling circuit, and an output node of the first inverter is coupled to the inverted output node of the sampling circuit;

a second inverter, wherein an input node of the second inverter is coupled to the inverted output node of the sampling circuit, and an output node of the second inverter is coupled to the output node of the sampling circuit; and an eleventh transistor, wherein a first node of the eleventh transistor is coupled to the system voltage terminal, a second node of the eleventh transistor is coupled to the first inverter and the second inverter, and a control node of the eleventh transistor receives a latch enable signal.

8. The sensing amplifier of claim 7, wherein the first inverter comprising:

a twelfth transistor, wherein a first node of the twelfth transistor is coupled to the second node of the eleventh transistor, and a control node of the twelfth transistor is coupled to the output node of the sampling circuit; and a thirteenth transistor, wherein a first node of the thirteenth transistor is coupled to a second node of the twelfth transistor and the inverted output node of the sampling circuit, a second node of the thirteenth transistor is coupled to the ground terminal, and a control node of the thirteenth transistor is coupled to the output node of the sampling circuit.

9. The sensing amplifier of claim 7, wherein the first inverter comprising:

a fourteenth transistor, wherein a first node of the fourteenth transistor is coupled to the second node of the eleventh transistor, and a control node of the fourteenth transistor is coupled to the inverted output node of the sampling circuit; and a fifteenth transistor, wherein a first node of the fifteenth transistor is coupled to a second node of the fourteenth transistor and the output node of the sampling circuit, a second node of the fifteenth transistor is coupled to the ground terminal, and a control node of the fifteenth transistor is coupled to the inverted output node of the sampling circuit.

10. A memory device, comprising:

a memory array, the memory array includes a data cell, a first reference cell with a first state and a second reference cell with a second state; and a sensing amplifier, coupled to the memory array, wherein the sensing amplifier comprises:

a sampling circuit, having a first sampling node, a second sampling node, a first state reference node coupling to the first reference cell to receive a first state reference voltage, a second state reference node coupling to the first reference cell to receive a second state reference voltage, an output node and an inverted output node, wherein the first sampling node and the second sampling node are coupled to the data cell, wherein the sampling circuit obtains a data voltage of the data cell, the first state reference voltage, and the second state reference voltage according to a bit line pre-charge signal and a standby signal, and the sampling circuit compares the data voltage, the first state reference voltage, and the second state reference voltage according to the bit line pre-charge signal and a word line to generate a first sampling signal on the output node and a second sampling signal on the inverted output node;

a latch circuit, coupled to the sampling circuit, wherein the latch circuit implements that the first sampling signal and the second sampling signal are inverted signals and latches the first sampling signal on the output node and the second sampling signal on the inverted output node; and a reset circuit, coupled to the sampling circuit, resetting the first sampling node, the second sampling node, the first state reference node, and the second state reference node as a preset voltage according to the standby signal, wherein the sampling circuit comprising:

a first transistor, wherein a first node of the first transistor is coupled to the first sampling node, a control node of the first transistor is coupled to the first state reference node;

a second transistor, wherein a first node of the second transistor is coupled to the second state reference node, a control node of the second transistor is coupled to the second sampling node;

a third transistor, wherein a first node of the third transistor is coupled to a second node of the first transistor and the output node; and a fourth transistor, wherein a first node of the fourth transistor is coupled to a second node of the second transistor and the inverted output node, control nodes of the third transistor and the fourth transistor receive the bit line pre-charge signal.

11. The memory device of claim 10, wherein the memory array further comprising:

a plurality of transmission transistors, each of the transmission transistors is coupled to the data cell, the first reference cell and the second reference cell respectively, and each of the transmission transistors are controlled by the word line.

12. The memory device of claim 10, further comprising:

a bit line multiplexer, coupled between the memory array and the sensing amplifier, wherein the bit line multiplexer couples the data cell, the first sampling node, and the second sampling node according to a bit line selection signal, couples the first reference cell and the first state reference node according to the bit line selection signal, and couples the second reference cell and the second state reference node according to the bit line selection signal.

13. The memory device of claim 10, wherein the second nodes of the third transistor and the fourth transistor are coupled to a ground terminal.

14. The sensing amplifier of claim 10, wherein the first transistor and the second transistor are p-type transistors, and the third transistor and the fourth transistor are n-type transistors.

15. The memory device of claim 10, wherein the reset circuit comprising:

a fifth transistor, wherein a first node of the fifth transistor is coupled to a system voltage terminal with the preset voltage, a second node of the fifth transistor is coupled to the first sampling node, and the control node of the fifth transistor is coupled to the standby signal;

a sixth transistor, wherein a first node of the sixth transistor is coupled to the system voltage terminal, a second node of the sixth transistor is coupled to the first state reference node, and the control node of the sixth transistor is coupled to the standby signal;

a seventh transistor, wherein a first node of the seventh transistor is coupled to the system voltage terminal, a second node of the seventh transistor is coupled to the second state reference node, and the control node of the seventh transistor is coupled to the standby signal;

an eighth transistor, wherein a first node of the eighth transistor is coupled to the system voltage terminal, a second node of the eighth transistor is coupled to the second sampling node, and the control node of the eighth transistor is coupled to the standby signal;

a nineth transistor, wherein a first node of the nineth transistor is coupled to the first reference cell of the memory array, a second node of the nineth transistor is coupled to the first state reference node, and the control node of the nineth transistor is coupled to the standby signal; and a tenth transistor, wherein a first node of the tenth transistor is coupled to the data cell of the memory array, a second node of the tenth transistor is coupled to the second sampling node, and the control node of the tenth transistor is coupled to the standby signal.

16. The memory device of claim 15, wherein the reset circuit further comprising:

a first capacitance, wherein a first node of the first capacitance is coupled to the data cell of the memory array, a second node of the first capacitance is coupled to the first sampling node ($X0$); and a second capacitance, wherein a first node of the second capacitance is coupled to the second reference cell of the memory array, a second node of the first capacitance is coupled to the second state reference node.

17. The memory device of claim 10, wherein the latch circuit comprising:

a first inverter, wherein an input node of the first inverter is coupled to the output node of the sampling circuit, and an output node of the first inverter is coupled to the inverted output node of the sampling circuit;

a second inverter, wherein an input node of the second inverter is coupled to the inverted output node of the sampling circuit, and an output node of the second inverter is coupled to the output node of the sampling circuit; and a eleventh transistor, wherein a first node of the eleventh transistor is coupled to the system voltage terminal, a second node of the eleventh transistor is coupled to the first inverter and the second inverter, and a control node of the eleventh transistor receives a latch enable signal.

18. A data read method of the memory array, wherein the memory array includes a data cell, a first reference cell with a first state and a second reference cell with a second state, the data read method comprising:

resetting a first sampling node, a second sampling node, a first state reference node, and a second state reference node of a sampling circuit in a sensing amplifier as a preset voltage according to a standby signal;

obtaining data voltages of the data cell on the first sampling node and the second sampling node of the sampling circuit, obtaining a first state reference voltage of the sampling circuit according to the first reference cell, and obtaining a second state reference voltage according to the second reference cell on the second state reference node of the sampling circuit according to a bit line pre-charge signal and the standby signal;

comparing the data voltages, the first state reference voltage, and the second state reference voltage according to the bit line pre-charge signal and a word line to generate a first sampling signal on the output node and a second sampling signal on the inverted output node by the sampling circuit in the sensing amplifier; and implementing that the first sampling signal and the second sampling signal are inverted signals and latching the first sampling signal on the output node and the second sampling signal on the inverted output node by a latch circuit in the sensing amplifier, wherein the sampling circuit comprising:

a first transistor, wherein a first node of the first transistor is coupled to the first sampling node, a control node of the first transistor is coupled to the first state reference node;

a second transistor, wherein a first node of the second transistor is coupled to the second state reference node, a control node of the second transistor is coupled to the second sampling node;

a third transistor, wherein a first node of the third transistor is coupled to a second node of the first transistor and the output node; and a fourth transistor, wherein a first node of the fourth transistor is coupled to a second node of the second transistor and the inverted output node, control nodes of the third transistor and the fourth transistor receive the bit line pre-charge signal.

19. The data read method of claim 18, wherein the second nodes of the third transistor and the fourth transistor are coupled to a ground terminal.

20. The data read method of claim 18, wherein the first transistor and the second transistor are p-type transistors, and the third transistor and the fourth transistor are n-type transistors.

\* \* \* \* \*